US008835800B2

(12) United States Patent
Tanaka et al.

(10) Patent No.: US 8,835,800 B2
(45) Date of Patent: Sep. 16, 2014

(54) LASER IRRADIATION APPARATUS AND METHOD FOR MANUFACTURING SEMICONDUCTOR DEVICE

(75) Inventors: Koichiro Tanaka, Kanagawa (JP); Yoshiaki Yamamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1191 days.

(21) Appl. No.: 11/389,508

(22) Filed: Mar. 27, 2006

(65) Prior Publication Data

US 2006/0252261 A1  Nov. 9, 2006

(30) Foreign Application Priority Data

Mar. 29, 2005  (JP) .................................. 2005-096212

(51) Int. Cl.
| | |
|---|---|
| B23K 26/00 | (2014.01) |
| H01L 21/44 | (2006.01) |
| H01L 27/12 | (2006.01) |
| B23K 26/08 | (2014.01) |
| B23K 26/04 | (2014.01) |
| G02B 26/10 | (2006.01) |
| B23K 26/073 | (2006.01) |
| G02B 27/09 | (2006.01) |

(52) U.S. Cl.
CPC ........ *H01L 27/1266* (2013.01); *H01L 27/1214* (2013.01); *B23K 26/083* (2013.01); *B23K 26/04* (2013.01); *G02B 26/10* (2013.01); *B23K 26/0869* (2013.01); *B23K 26/0738* (2013.01); *G02B 27/0911* (2013.01)
USPC .............. 219/121.65; 219/121.8; 219/121.73; 219/121.77; 219/121.83; 219/121.85; 438/662; 438/149; 438/308; 438/689; 438/166

(58) Field of Classification Search
USPC ......... 438/662, 149, 308, 689, 166, 487, 795; 219/121.6, 121.8, 121.73, 121.74, 219/121.75, 121.77, 121.82, 121.83, 219/121.84, 121.85
See application file for complete search history.

(56) References Cited

U.S. PATENT DOCUMENTS 5,420,876 A * 5/1995 Lussier et al. .................. 372/22
5,847,819 A * 12/1998 Yanagi .......................... 356/124

(Continued)

FOREIGN PATENT DOCUMENTS

| JP | 07-024587 | 1/1995 |
|---|---|---|
| JP | 10-041244 | 2/1998 |

(Continued)

OTHER PUBLICATIONS

International Search Report dated Jun. 27, 2006 for Application No. PCT/JP2006/306593.

(Continued)

*Primary Examiner* — Dana Ross
*Assistant Examiner* — Ket D Dang
(74) *Attorney, Agent, or Firm* — Eric J. Robinson; Robinson Intellectual Property Law Office, P.C.

(57) ABSTRACT

The present invention provides a laser irradiation apparatus which can accurately control positions of beam spots of laser beams emitted from laser oscillators and the distance between the adjacent beam spots. A laser irradiation apparatus of the present invention includes a first movable stage with an irradiation body provided, two or more laser oscillators emitting laser beams, a plurality of second movable stages with the laser oscillators and optical systems provided, and a means for detecting at least one alignment maker. The first stage and the second stages may move not only in one direction but also in a plurality of directions. Further, the optical systems are to shape the laser beams emitted from the laser oscillators into linear beams on the irradiation surface.

55 Claims, 18 Drawing Sheets

(56) References Cited

U.S. PATENT DOCUMENTS

| | | |
|---|---|---|
| 6,700,096 B2 | 3/2004 | Yamazaki et al. |
| 6,897,166 B2 | 5/2005 | Sotani et al. |
| 6,943,086 B2 | 9/2005 | Hongo et al. |
| 6,962,860 B2 | 11/2005 | Yamazaki et al. |
| 6,979,605 B2 | 12/2005 | Yamazaki et al. |
| 7,129,124 B2 | 10/2006 | Hongo et al. |
| 7,239,161 B2 | 7/2007 | Iwanaga et al. |
| 7,304,005 B2 * | 12/2007 | Yamazaki et al. ............ 438/795 |
| 7,547,866 B2 | 6/2009 | Tanaka et al. |
| 7,812,283 B2 * | 10/2010 | Tanaka et al. ............ 219/121.73 |
| 2002/0031242 A1 * | 3/2002 | Yasui et al. ................ 382/104 |
| 2002/0190435 A1 * | 12/2002 | O'Brien et al. ............... 264/400 |
| 2002/0191301 A1 * | 12/2002 | Tanaka ......................... 359/668 |
| 2003/0052105 A1 * | 3/2003 | Nagano et al. ........... 219/121.83 |
| 2003/0153182 A1 | 8/2003 | Yamazaki et al. |
| 2003/0169502 A1 | 9/2003 | Ogura |
| 2003/0171837 A1 | 9/2003 | Yamazaki et al. |
| 2004/0041158 A1 | 3/2004 | Hongo et al. |
| 2004/0053450 A1 * | 3/2004 | Sposili et al. ................. 438/151 |
| 2004/0132266 A1 | 7/2004 | Yamazaki et al. |
| 2005/0214986 A1 | 9/2005 | Tanaka et al. |
| 2005/0277028 A1 | 12/2005 | Yamazaki et al. |
| 2007/0041410 A1 | 2/2007 | Hongo et al. |

FOREIGN PATENT DOCUMENTS

| | | | | |
|---|---|---|---|---|
| JP | 10249564 A | * | 9/1998 | ............ B23K 26/00 |
| JP | 2000-005891 A | | 1/2000 | |
| JP | 2000-277451 A | | 10/2000 | |
| JP | 2001-044133 | | 2/2001 | |
| JP | 2004-103628 | | 4/2004 | |
| JP | 2004-111584 A | | 4/2004 | |
| JP | 2004-151668 | | 5/2004 | |
| JP | 2004-153150 A | | 5/2004 | |
| KR | 2004-0019879 A | | 3/2004 | |

OTHER PUBLICATIONS

Written Opinion dated Jun. 27, 2006 for Application No. PCT/JP2006/306593.

Korean Office Action (Application No. 2007-7024678) Dated Jun. 12, 2012.

\* cited by examiner

LASER IRRADIATION APPARATUS AND METHOD FOR MANUFACTURING SEMICONDUCTOR DEVICE

TECHNICAL FIELD

The present invention relates to a laser irradiation apparatus for irradiating an irradiation body with a linear beam, and also relates to a method for manufacturing a semiconductor device using the laser irradiation apparatus.

BACKGROUND ART

In recent years, techniques for manufacturing a thin film transistor (hereinafter also referred to as a TFT) over a substrate have progressed drastically and application thereof to an active matrix display device has been advanced. In some of such techniques, lasers are used for manufacturing TFTs. For example, a laser annealing technique, a laser doping technique, a laser scribing technique, and the like are given.

Moreover, since a TFT using a polycrystalline semiconductor film has higher electric field effect mobility (also referred to as mobility, simply) than a TFT using a conventional amorphous semiconductor film, high-speed operation is possible. Therefore, for example in an active matrix display device including the TFT using the polycrystalline semiconductor film, a pixel TFT which has been conventionally controlled by a driver circuit portion provided outside a substrate is tried to be controlled by a driver circuit TFT formed over the same substrate as the pixel TFT.

In the meanwhile, a substrate used for a semiconductor device is expected to be a glass substrate rather than a quartz substrate in point of its cost. Moreover, since a glass substrate can be enlarged more easily than a quartz substrate, it is possible to manufacture a large number of semiconductor devices over a large glass substrate, so that the number of devices obtained from one substrate can be increased. As a result, the unit cost of a semiconductor device can be decreased, which is also convenient for mass production.

However, since a glass substrate has low heat resistance and is easily deformed due to heat, when a semiconductor film formed over a glass substrate is crystallized using a conventional annealing method which utilizes radiation heat or conduction heat, the glass substrate is deformed due to the heat or the time required for the crystallization is unrealistically long. On the other hand, when a laser annealing method is applied to this step, a laser beam can locally heat a semiconductor film formed over a glass substrate; therefore, thermal deformation of the glass substrate can be suppressed. As compared with the annealing method using radiation heat or conduction heat, the laser annealing method has advantages that the process time can be drastically shortened and a semiconductor substrate or a semiconductor film over a substrate can be selectively and locally heated so that the substrate is hardly damaged due to heat.

The laser annealing herein described includes a technique for heating an amorphous layer, a damaged layer formed in a semiconductor substrate or a semiconductor film, a technique for crystallizing an amorphous semiconductor film formed over a substrate, a technique applied to flattening and modification of a surface of a semiconductor substrate or a semiconductor film, and the like.

Laser oscillators used for the laser annealing are categorized broadly into pulsed laser oscillators and continuous wave (hereinafter abbreviated to CW) laser oscillators according to the oscillation method. In recent years, it is found that, in the crystallization of a semiconductor film, the grain diameter of a crystal formed in the semiconductor film is larger when using a CW laser oscillator such as an Ar laser or a $YVO_4$ laser than when using a pulsed laser oscillator such as an excimer laser. When the grain diameter of a crystal in the semiconductor film becomes larger, the number of grain boundaries in a channel region in a TFT formed using the semiconductor film decreases so that the mobility increases. Therefore, development of a high-performance device is possible by using a CW laser oscillator. In this specification, a region where such large crystal grains gather is referred to as a large grain crystal region.

Further, in order to increase the absorption efficiency of a laser beam (also referred to as laser light) to a semiconductor film, a laser beam having a wavelength in a visible or ultraviolet range is used in laser annealing of the semiconductor film. However, the wavelength of a laser beam emitted from a solid-state laser medium used in a CW laser is usually in red to near-infrared ranges, which is low in the absorption efficiency to the semiconductor film. Therefore, in the case of applying a CW solid-state laser to a laser annealing step, a non-linear optical element is used to convert the laser beam into a harmonic having a wavelength in the visible range or shorter. Usually, a method for converting the fundamental wave, whose wavelength is in a near infrared region and with which high output power is easily obtained, into a second harmonic, which is a green laser beam, has the highest conversion efficiency and is often used.

For example, if a CW laser beam with an output power of 10 W and a wavelength of 532 nm is shaped into a linear beam having a length of approximately 300 μm on a long side and approximately 100 μm on a short side and this CW linear beam is moved in its short-side direction to crystallize a semiconductor film, the width of a large grain crystal region obtained by one scan of the linear beam is approximately 200 μm. Therefore, in order to crystallize all over the semiconductor film formed over the whole surface of a comparatively large substrate with the CW laser beam, it is necessary to conduct laser annealing in such a way that a position where the linear beam is scanned is displaced in its long-side direction by the width of the large grain crystal region obtained by the one scan of the linear beam.

On the other hand, at the same time as the formation of the large grain crystal region, a crystal region which is not a large grain crystal region (this crystal region is referred to as an inferior crystalline region hereinafter) is formed at ends of the linear beam in its long-side direction where the energy is attenuated. The surface of the inferior crystalline region is uneven and is not suitable for manufacturing TFTs thereon. If TFTs are manufactured using the inferior crystalline region, variation in the electric characteristic and operation defects are caused.

In view of the above, in order to manufacture a highly reliable device, it is necessary to correctly determine an irradiation position of a laser beam so that TFTs are not manufactured using the inferior crystalline region.

As a laser irradiation method used in the laser annealing, a method is given in which a sample is provided over an XY stage and a beam spot formed on the sample by using a predetermined optical system is scanned relative to the sample so that laser annealing is conducted to the whole surface of the substrate. At this time, in order to correctly determine the irradiation position of the laser beam, a marker serving as a reference point is provided on an irradiation surface and an image of the marker is recorded using a CCD camera. Then, the position of the marker is detected by an image processing means such as pattern matching. The irradiation surface is moved in accordance with the position of the marker so that the position to be irradiated is controlled. Such a method has been disclosed (see, for example, Patent Document 1: Japanese Patent Application Laid-Open No. 2004-103628).

DISCLOSURE OF INVENTION

However, the method disclosed in Patent Document 1 has a problem in that the productivity is low. For example, when the whole surface of a semiconductor film formed over a glass substrate having a length of 1000 mm on each side is annealed with one linear beam having a length of 300 μm on a long side, it is necessary to repeat scanning of the beam 3,000 times or more. Therefore, it takes much time to anneal a large substrate.

Accordingly, in order to increase the productivity, a method is considered in which an irradiation body 501 is scanned while being simultaneously irradiated with linear beams 500a, 500b, and 500c emitted from three laser oscillators 504, 505, and 506 in such a way that the linear beams 500a, 500b, and 500c are arranged side by side on the irradiation surface (see FIG. 5).

In this case, since three positions on the irradiation surface can be irradiated respectively with the three laser beams emitted from the three laser oscillators, the number of scanning times can be reduced to ⅓ as compared with the case of using one laser oscillator to process the whole surface. The process speed gets higher as the number of laser oscillators increases. However, this method has a problem in yield, which is described below with reference to FIGS. 5 to 7.

FIG. 6 is a top view of the irradiation body 501 shown in FIG. 5. Here, three laser oscillators are used. As shown in FIG. 6, a first laser oscillator starts to move from a position A1, a second laser oscillator starts to move from a position A2, and a third laser oscillator starts to move from a position A3. In this case, first, laser beams emitted from the three laser oscillators are shaped into linear laser beams by adjusting optical systems. However, when the optical systems are adjusted in order to shape the laser beams emitted from the laser oscillators into linear beams, the respective positions of the linear beams are displaced from the desired positions A1, A2, and A3. Therefore, it is necessary to match the starting points to A1, A2, and A3 by adjusting the optical systems while keeping the linear shape of the laser beam. After matching the irradiation starting position of the linear beams to A1, A2, and A3 by adjusting the optical systems, the irradiation body 501 is moved in an X-axis direction and a Y-axis direction to irradiate the substrate with the linear beams.

However, it is very difficult to adjust the optical system so as to match the irradiation positions of the linear beams to the predetermined positions while keeping the shapes of the linear beams. Therefore, actually strict alignment of each linear beam is not carried out and the irradiation with the linear beams 500a, 500b, and 500c starts from positions displaced from the predetermined irradiation starting positions A1, A2, and A3 (see FIG. 6). Then, the linear beams irradiate in directions indicated by dotted-line arrows in FIG. 7. However, in this case, when the irradiation is completed, a region 502 not irradiated with the linear beam and a region 503 irradiated with the linear beam multiple times are formed as shown in FIG. 7. Therefore, in the case of using the laser irradiation apparatus shown in FIG. 5, it is difficult to carry out the laser irradiation homogeneously to the whole surface of the substrate. Since the linear beam is scanned in the X-axis direction and the Y-axis direction on a large substrate for several hundred times, if the irradiation starting position of each linear beam is displaced from the desired position by several μm, the widths of the region 502 not irradiated with the laser beam and the region 503 irradiated with the laser beam multiple times are approximately several tens μm. If TFTs are manufactured using a portion including the region 502 or 503 on the semiconductor film crystallized by such laser irradiation, the TFT characteristic deteriorates badly and the variation in the characteristic among the TFTs increases.

Thus, when a plurality of laser beams are scanned while simultaneously irradiating an irradiation body, it is necessary to correctly and simply control the distance between the beam spots and the positions of the beam spots formed on the irradiation body by the laser beams emitted from laser oscillators. Otherwise, TFTs may be manufactured using regions that are not crystal regions, which can cause an adverse effect on yield.

Consequently, it is an object of the present invention to provide a laser irradiation apparatus providing high productivity which irradiates predetermined positions on an irradiation body with a plurality of laser beams to conduct homogeneous laser irradiation to the irradiation body, and to provide a method for manufacturing a semiconductor device using the laser irradiation apparatus.

In view of the above problems, a laser irradiation apparatus of the present invention is equipped with a mechanism for independently moving two or more laser oscillators in order to move laser beams emitted from the two or more laser oscillators to irradiation positions.

A laser irradiation apparatus of the present invention includes a plurality of laser oscillators for emitting laser beams, a plurality of optical systems for shaping the laser beams into linear beams on a surface of an irradiation body, means for moving the irradiation body in directions along short sides of the linear beams, means for moving the plurality of laser oscillators independently in directions along long sides of the linear beams, and means for detecting at least one alignment marker.

A laser irradiation apparatus of the present invention includes a plurality of laser oscillators for emitting laser beams; a plurality of optical systems for shaping the laser beams into linear beams on a surface of an irradiation body; means for detecting at least one alignment marker, which has an alignment marker detecting means and an image processing device; a first stage which can move in a short-side direction of the linear beam and over which the irradiation body is provided; and a plurality of second stages which can move in a long-side direction of the linear beam; wherein each of the laser oscillators and each of the optical systems are provided over each of the second stages, and wherein each of the second stages has an independent moving mechanism.

In the laser irradiation apparatus of the present invention, the alignment marker detecting means is a CCD camera.

The shape of the linear beam is rectangular or elliptical.

In the laser irradiation apparatus of the present invention, the laser oscillator is a YAG laser, a YVO$_4$ laser, a GdVO$_4$ laser, a YLF laser, or an Ar laser.

In the laser irradiation apparatus of the present invention, the plurality of laser oscillators respectively have different output power.

A method for manufacturing a semiconductor device of the present invention includes the steps of providing an insulating substrate having an amorphous semiconductor film over a first stage, moving a plurality of second stages independently in a predetermined direction, irradiating a surface of the amorphous semiconductor film with a plurality of linear beams emitted from a plurality of laser oscillators provided over the plurality of second stages, and moving the first stage in a direction along a short side of the linear beam while irradiating a plurality of points on the surface of the amorphous semiconductor film with the plurality of linear beams, thereby crystallizing the amorphous semiconductor film. The predetermined direction is along a long side of the linear beam.

A method for manufacturing a semiconductor device of the present invention includes the steps of providing an insulating substrate having an amorphous semiconductor film over a first stage, forming a plurality of alignment markers by the amorphous semiconductor film, irradiating a surface of the amorphous semiconductor film with a plurality of linear beams emitted from a plurality of laser oscillators provided over a plurality of second stages, and irradiating a plurality of points on the surface of the amorphous semiconductor film with the plurality of linear beams by adjusting irradiation positions of the linear beams in such a way that the plurality of second stages are moved independently in a direction along a long side of the linear beam based on positions of the alignment markers, and moving the first stage in a direction along a short side of the linear beam while irradiating with the linear beam, thereby crystallizing the amorphous semiconductor film.

In the method for manufacturing a semiconductor device of the present invention, each of the plurality of second stages is provided with one laser oscillator.

In the method for manufacturing a semiconductor device of the present invention, the plurality of laser oscillators respectively have different output power.

In this specification, a laser beam whose shape on an irradiation surface is linear is referred to as a linear beam. The term "linear" herein used does not means a line in a strict sense, but means a rectangle having a high aspect ratio (for example, an aspect ratio of 10 or more (preferably 100 or more)). The laser beam is shaped into a linear beam in order to increase the efficiency of laser annealing, and may be rectangular or elliptical in shape.

According to the present invention, in an apparatus for irradiating an irradiation body simultaneously with a plurality of laser beams emitted from a plurality of laser oscillators, it becomes very easy to adjust irradiation positions of the laser beams. At the same time, the irradiation positions are adjusted with certainty. Therefore, the time required for maintenance can be shortened drastically and accordingly, the productivity can be improved. Further, since the irradiation position can be adjusted by moving the laser oscillator, the laser irradiation position can be finely adjusted, which makes it possible to avoid the formation of a region not irradiated with the laser beam and a region irradiated with the laser beam multiple times. Thus, by using the laser irradiation apparatus shown in any one of embodiment modes of this specification to crystallize, for example, a semiconductor film, the productivity and the yield can be improved.

BEST MODE FOR CARRYING OUT THE INVENTION

Embodiment Mode 1

Figure 1:
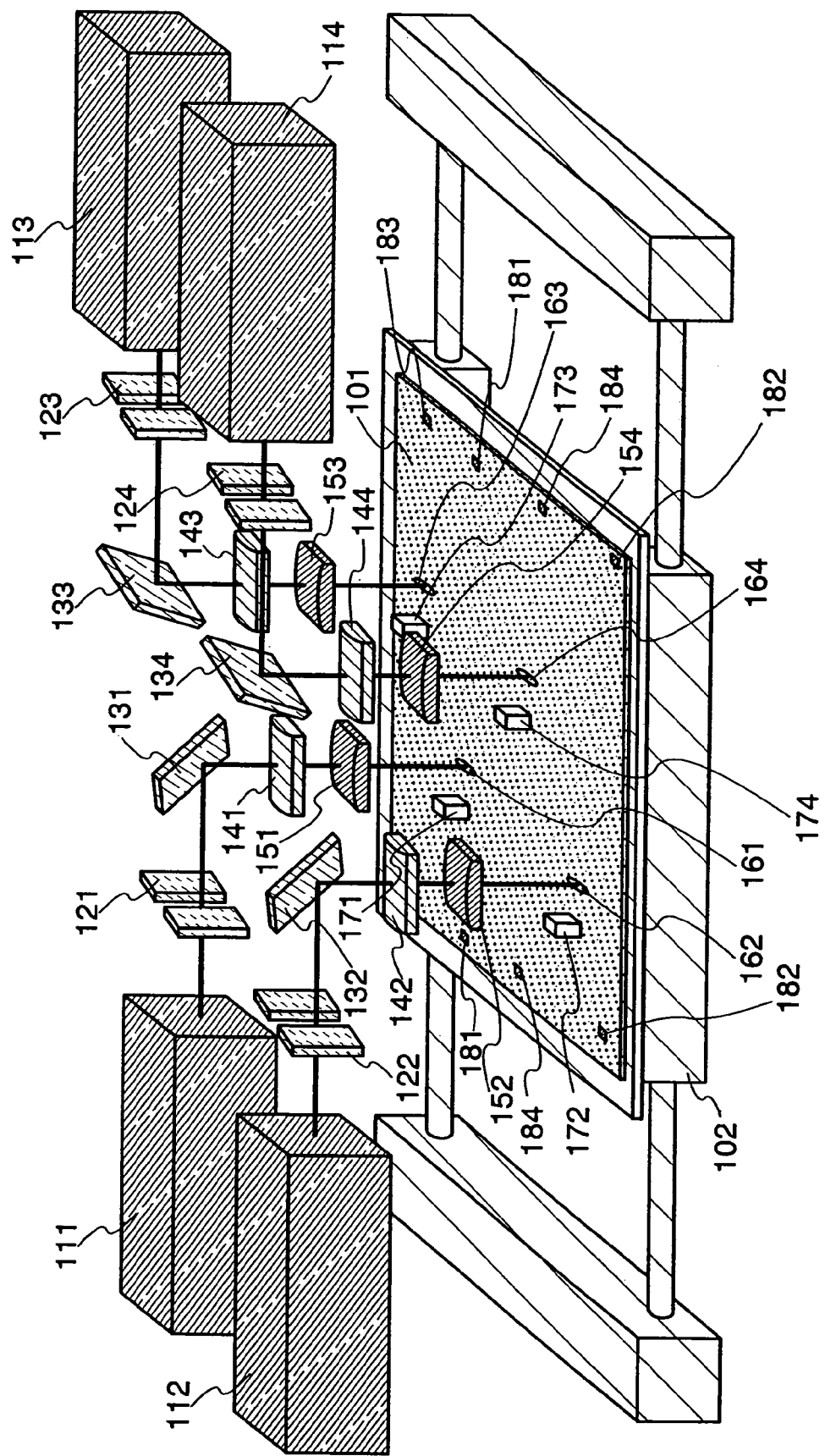
FIG. 1 shows a structure of a laser oscillator of the present invention.

Embodiment Mode 1 will describe a structure of a laser irradiation apparatus equipped with a moving mechanism which can independently adjust irradiation positions of a plurality of linear beams on an irradiation surface. However, since the present invention can be embodied in many different modes, it is understood by those skilled in the art that the mode and detail can be variously changed without departing from the scope and spirit of the present invention. Therefore, the present invention should not be construed as being limited to the description of this embodiment mode. This embodiment mode of the present invention can be freely combined with another embodiment modes.

First, an optical system for forming a linear beam is described with reference to FIG. 1. In Embodiment Mode 1, a first optical system including a slit 121, a mirror 131, and cylindrical lenses 141 and 151; a second optical system including a slit 122, a mirror 132, and cylindrical lenses 142 and 152; a third optical system including a slit 123, a mirror 133, and cylindrical lenses 143 and 153; and a fourth optical system including a slit 124, a mirror 134, and cylindrical lenses 144 and 154 are provided for emission sides of laser oscillators 111, 112, 113, and 114, respectively.

The laser oscillators 111, 112, 113, and 114 are CW laser oscillators or pulsed laser oscillators which emit laser beams at a repetition rate of 10 MHz or more. The laser oscillators to be used in this embodiment mode are not limited in particular, and either pulsed or CW laser oscillators may be used. For example, an excimer laser, a YAG laser, a $YVO_4$ laser, a $GdVO_4$ laser, a YLF laser, an Ar laser, and the like are given. Further, other laser oscillators may also be used. The number of laser oscillators is four in this embodiment mode; however, the number thereof is not limited to four as long as it is two or more, and may be determined appropriately depending on the size of the substrate to be used, the size of the laser oscillator, and the like.

A low-intensity part of a laser beam emitted from the laser oscillator 111 is blocked by the slit 121, and the laser beam is deflected for a direction of an irradiation body 101 by the mirror 131. The slit 121 is provided so as to decrease the low-intensity part of the laser beam, which is formed at ends of the linear beam on the irradiation surface, as much as possible.

The laser beam deflected by the mirror 131 passes through the cylindrical lens 141 acting in only one direction. Moreover, the laser beam passed through the cylindrical lens 141 is condensed by the cylindrical lens 151 acting in only one direction which is rotated by 90° with respect to the cylindrical lens 141, so that the laser beam is shaped into a linear beam 161. Then, the linear beam 161 is delivered onto the irradiation body 101. Similarly, laser beams emitted from the laser oscillators 112, 113, and 114 are shaped by the slits, mirrors, and cylindrical lenses and linear beams 162, 163, and 164 are delivered onto the irradiation surface. The cylindrical lenses 141, 142, 143, and 144 act in only a long-side direction of the linear beam on the irradiation surface, while the cylindrical lenses 151, 152, 153, and 154 act in only a short-side direction thereof.

Here, a positional relation between the cylindrical lenses 141, 142, 143, and 144; the slits 121, 122, 123, and 124; and the irradiation surface of the irradiation body 101 is described in more detail. Since the optical systems used in combination with the four laser oscillators are the same, an optical system corresponding to the laser oscillator 111 is described as a representative. First, it is assumed that the focal length of the cylindrical lens 141 is f and the width of the slit 121 is s. At this time, the optical path length from the slit 121 to the cylindrical lens 141 is assumed to be M1, while that from the cylindrical lens 141 to the irradiation body 101 is assumed to be M2. Moreover, the length of the linear beam in a long-side direction formed on the irradiation surface of the irradiation body 101 is assumed to be L. Then, the following two formulas hold.

$$\frac{s}{L} = \frac{M1}{M2} \quad \text{formula (1)}$$

$$\frac{1}{f} = \frac{1}{M1} + \frac{1}{M2} \quad \text{formula (2)}$$

The following formulas are derived from the above formulas (1) and (2).

$$M1 = \frac{f(s+L)}{L} \quad \text{formula (3)}$$

$$M2 = \frac{f(s+L)}{s} \quad \text{formula (4)}$$

By arranging the slits, the cylindrical lenses, and the irradiation body so as to satisfy these relations, a linear beam with no effect of diffraction due to the slit can be projected to the irradiation surface. The slit is used to reduce the area of the inferior crystalline region as much as possible; on the other hand, the slit has a defect that periodical energy distribution is generated due to the effect of diffraction. Usually, when the laser beam is partially blocked by the slit, a phenomenon of light diffraction occurs. The light diffraction causes periodical energy distribution to occur on the irradiation surface. However, at a position just after the laser beam is blocked by the slit, the periodical energy distribution due to the diffraction does not occur. Therefore, by providing the optical system at a position satisfying the above formulas, a linear beam with no effect of diffraction due to the slit can be obtained. Accordingly, a linear beam with homogeneous energy distribution can be irradiated to the irradiation surface.

The optical system for forming the linear beam is not limited to the optical system shown in this embodiment mode. For example, the slit is not necessarily provided, or a fly-eye lens, a cylindrical lens array, a diffractive optical element, or the like may be used instead of the cylindrical lens. Further, these may be used in combination appropriately. In this embodiment mode, the optical systems with the same structure are arranged in accordance with the four laser oscillators respectively; however, this embodiment mode is not limited to this structure. For example, optical systems with different structures may be arranged in accordance with the respective laser oscillators. By arranging the optical systems with different structures in accordance with the laser oscillators, it is possible to change characteristics of the linear beams to be delivered onto an irradiation surface, such as energy distribution and energy density of the linear beams. Since crystallinity of crystal regions which are crystallized by the linear beams can be varied by changing the characteristics of the linear beams such as the energy distribution and the energy density, the characteristic of each device can be controlled when manufacturing devices with different characteristics over one substrate.

Further, in the case of manufacturing one device over the crystal regions formed by the linear beams with the different characteristics, the variation in the characteristic of the device can be suppressed to the minimum by adjusting so that the characteristics of the linear beams such as the energy distribution and the energy density become uniform with the use of a polarizing plate, a filter, or other energy adjusting means. Although not illustrated here, the laser oscillators and the optical system having the slit, the mirror, and the cylindrical lens are provided onto a movable Y-axis stage. Moreover, reference numerals 171, 172, 173, and 174 denote means for detecting alignment markers. Here, a CCD camera is used as the means for detecting alignment markers.

Next, structures of an X-axis stage 102 and a plurality of Y-axis stages 201, 202, 203, and 204 are described with reference to FIG. 2. FIG. 2 is the drawing in which the Y-axis stages 201, 202, 203, and 204 are added to FIG. 1, and the same parts as those in FIG. 1 are denoted with the same reference numerals and the description to such parts is omitted. Here, an X-axis direction means a short-side direction of the linear beam, while a Y-axis direction means a long-side direction of the linear beam. In this specification, a direction toward a positive direction on the Y axis coordinate is defined as a Y-axis direction and a direction toward a negative direction on the Y axis coordinate is defined as a −Y-axis direction, while a direction toward a positive direction on the X axis coordinate is defined as an X-axis direction and a direction toward a negative direction on the X axis coordinate is defined as a −X-axis direction.

In this embodiment mode, an X-axis stage 102 freely movable in the X-axis direction is provided over a table 211 and the Y-axis stages 201, 202, 203, and 204 movable in the Y-axis direction are provided over the X-axis stage 102. In other words, the X-axis stage 102 is provided on the table 211, and the Y-axis stages 201 and 202 are provided over the X-axis stage 102 by a support of a supporter 241 extending between supporters 231 and 232 provided at sides of the X-axis stage 102. Similarly, the Y-axis stages 203 and 204 are provided over the X-axis stage 102 by a support of a supporter 242 extending between supporters 233 and 234 provided at opposite sides of the X-axis stage 102. In this embodiment mode, it is possible to move each of the Y-axis stages 201, 202, 203, and 204 by any distance along the supporter 241 or 242 without interlocking with each other. It is to be noted that the structures of the Y-axis stage and the supporters shown in this embodiment mode are just one example, and another structure is also applicable as long as the laser oscillators can be moved independently. Moreover, the number of Y-axis stages is the same as that of the laser oscillators in this embodiment mode.

Figure 2:
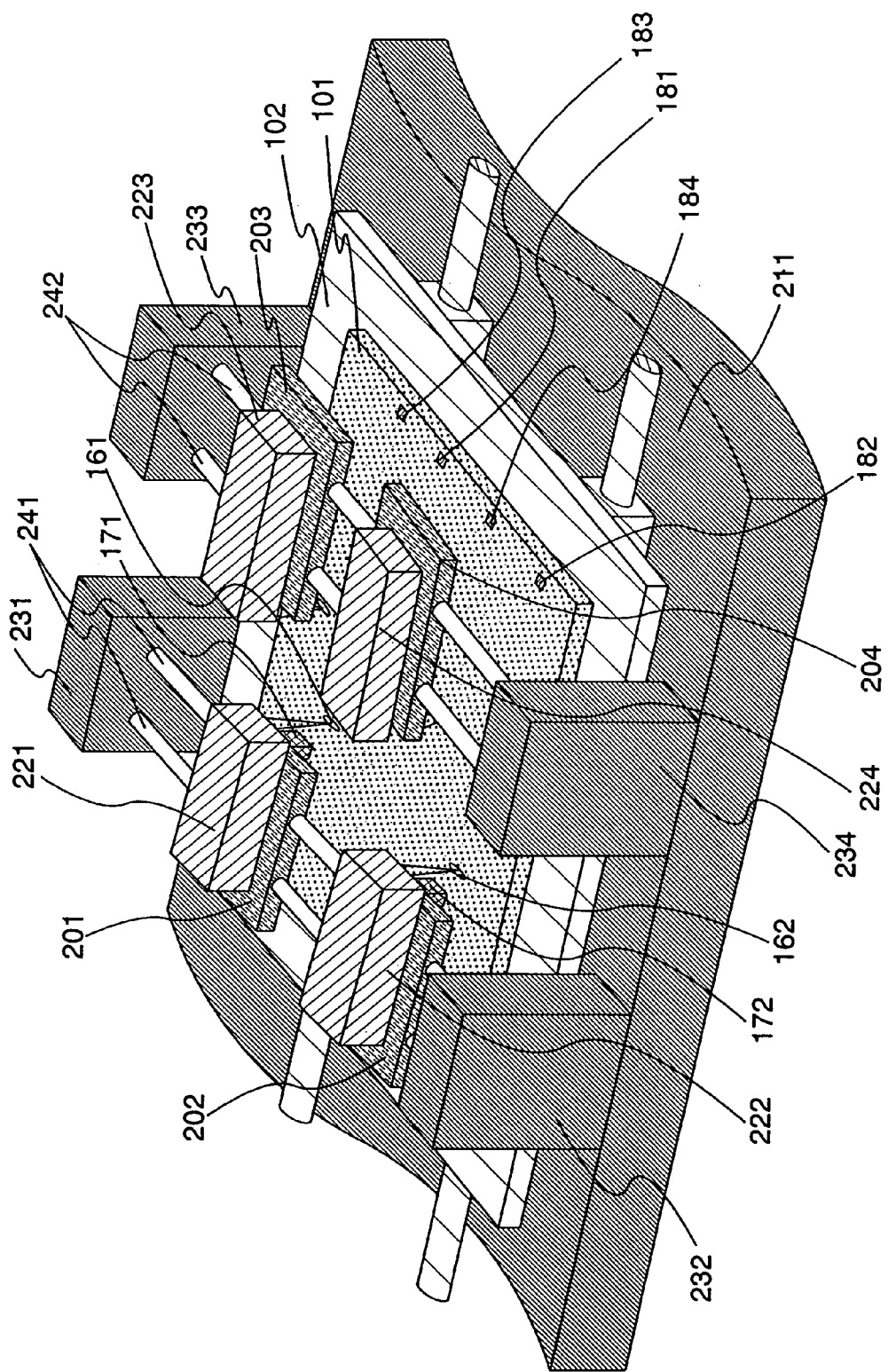
FIG. 2 shows a structure of a laser oscillator of the present invention.

Over the Y-axis stage 201, the first optical system for forming a linear beam, the laser oscillator 111, and the CCD camera 171 shown in FIG. 1 are arranged. Similarly, the second optical system for forming a linear beam, the laser oscillator 112, and the CCD camera 172 shown in FIG. 1 are provided for the Y-axis stage 202. The third optical system for forming a linear beam, the laser oscillator 113, and the CCD camera 173 (not shown in FIG. 2) shown in FIG. 1 are provided for the Y-axis stage 203. The fourth optical system for forming a linear beam, the laser oscillator 114, and the CCD camera 174 (not shown in FIG. 2) shown in FIG. 1 are provided for the Y-axis stage 204. Here, the first optical system and the laser oscillator 111 are collectively denoted with a reference numeral 221, the second optical system and the laser oscillator 112 are collectively denoted with a reference numeral 222, the third optical system and the laser oscillator 113 are collectively denoted with a reference numeral 223, and the fourth optical system and the laser oscillator 114 are collectively denoted with a reference numeral 224 in FIG. 2.

By moving the Y-axis stages 201, 202, 203, and 204 respectively in the Y-axis direction, the linear beams 161, 162, 163, and 164 formed on the irradiation surface also move in the Y-axis direction. Here, one laser oscillator and the optical systems are provided over each of the Y-axis stages 201, 202, 203, and 204. In other words, one laser oscillator is provided over one Y-axis stage. If a plurality of laser oscillators are provided over one Y-axis stage, the distance between the linear beams emitted from the adjacent laser oscillators needs to be adjusted by using the optical system; therefore, accurate alignment is difficult.

Figure 8:
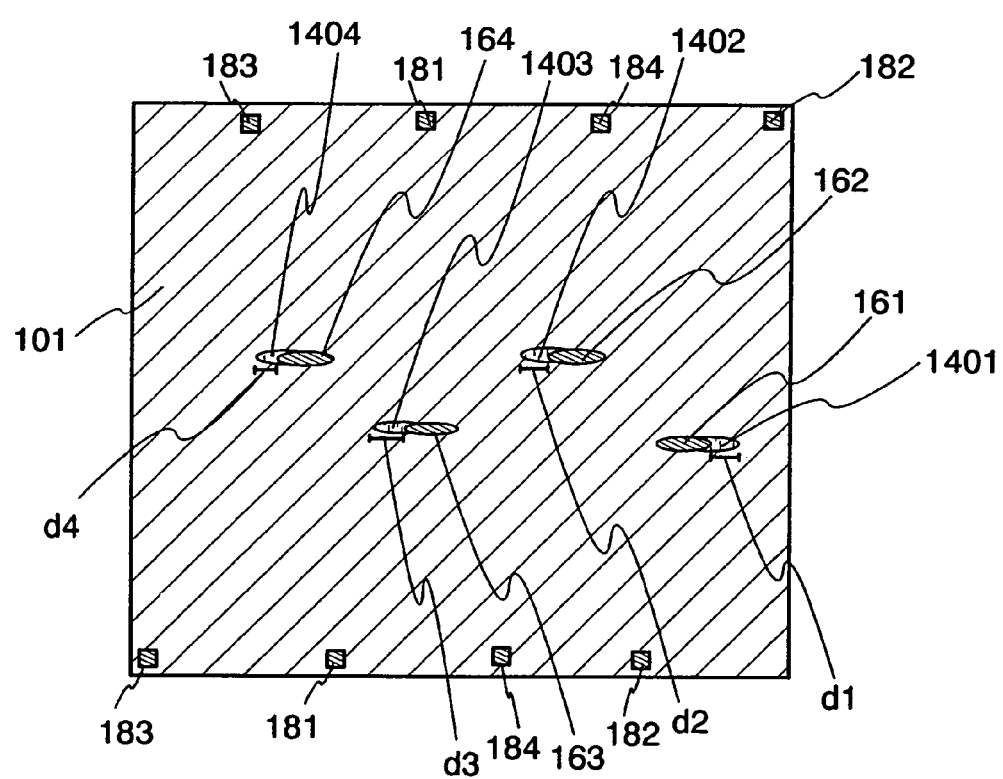
FIG. 8 shows laser irradiation using laser irradiation using a laser oscillator of the present invention.

In this embodiment mode, irradiation positions of the linear beams 161, 162, 163, and 164 formed by the respective optical systems are displaced from preset irradiation starting positions 1401, 1402, 1403, and 1404 by distances d1, d2, d3, and d4, respectively, for example, as shown in FIG. 8. That is because if the optical systems are finely adjusted to form the linear beams, the interactive positions of the linear beams may be displaced from the desired positions. The above distances d1, d2, d3, and d4 are not necessarily different from each other.

Therefore, based on the positional information of each alignment marker obtained by detecting the alignment markers with the CCD cameras, the four Y-axis stages are moved to move the respective linear beams correctly to the irradiation positions. In other words, each of the Y-axis stages 201, 202, 203, and 204 is moved in a Y-axis direction or a -Y-axis direction by d1, d2, d3, and d4 to match the linear beams 161, 162, 163, and 164 to the laser irradiation starting positions 1401, 1402, 1403, and 1404.

Here, a means for reading the alignment markers is described with reference to FIGS. 1 and 2. A surface of the irradiation body 101 is imaged by the CCD cameras 171, 172, 173, and 174 by moving the respective CCD cameras provided to the four Y-axis stages 201, 202, 203, and 204, so that the positions of alignment markers 181, 182, 183, and 184 are recognized. Here, by carrying out image processing such as pattern matching with an image processing device connected to the CCD camera, the positions of the alignment markers are recognized. After that, based on the positional information of the alignment markers obtained by the pattern matching process, the Y-axis stages 201, 202, 203, and 204 are moved so as to match each linear beam to the predetermined irradiation starting position. Here, the position of the alignment marker 181 is detected by the CCD camera 171, the position of the alignment marker 182 is detected by the CCD camera 172, the position of the alignment marker 183 is detected by the CCD camera 113, and the position of the alignment marker 184 is detected by the CCD camera 174. In other words, each CCD camera detects only the positional information of the alignment marker corresponding to the laser beam emitted from the laser oscillator provided over the same Y-axis stage.

In this embodiment mode, only a contour portion is extracted from an image obtained by reading reflected light on the surface of the irradiation body with the CCD camera by a Sobel process or the like. Then, pattern matching is conducted in such a way that the image of the contour portion is compared with an image of the alignment marker pre-registered in the image processing device, thereby detecting the position of the alignment marker. By conducting the pattern matching with the image of which only the contour portion is abstracted, the pattern matching can be conducted stably without being affected by the change of the reflectivity at the surface of the irradiation body. The method for recognizing the position of the alignment markers is not limited to this method. For example, the pattern of the alignment markers obtained from CAD data may be registered in the image processing device. The information to be registered here is obtained not from the numerals expressing the contrast difference between the pixels of the CCD camera in multi-grayscale, but from binarized contrast difference. At this time, the information to be registered in the image processing device is only the shape of the alignment marker or the contour portion of the image. Even in this case, the pattern matching is carried out on the pattern in which only the contour portion is abstracted by a Sobel process or the like from the image read by the CCD camera and the pattern obtained from CAD data pre-registered in the image processing device.

When the alignment markers formed on the irradiation body are read by the CCD camera, if a white light source having wavelengths over all the visible range is used, the total amount of the reflected light does not differ greatly even though the irradiation body has an absorption band of a particular wavelength. Therefore, favorable contrast is difficult to be obtained. Accordingly, it is preferable to use a light source of a single color, which corresponds to an absorption wavelength range existing in the irradiation body. In the case of using a semiconductor film as the irradiation body, it is preferable to use a light source with a short wavelength that is not longer than the visible range, which is an absorption wavelength range of the semiconductor film, as a light source for determining the irradiation position of the laser beam on the semiconductor film. For example, since amorphous silicon much absorbs wavelengths of 500 nm or shorter, it is preferable to use a light source with a wavelength of 500 nm or less. Moreover, in the case of using an amorphous silicon film as a semiconductor film and a silicon oxide film as a base film, it is preferable to use a light source with a wavelength range of 200 to 500 nm because the silicon oxide film does not absorb wavelengths near 500 nm but starts to absorb light with wavelengths of from near 200 nm.

Even in the case where the contrast of the alignment marker is low due to the complexity of a film structure, the intensity of reflected light at the contour portion of the alignment marker changes by recording reflected light from such a light source of a single color and carrying out an image processing, which allows the recognition of at least the contour portion. Therefore, the position of the alignment marker can be recognized regardless of the contrast. Moreover, the alignment markers can be recognized even when film-thickness distribution exists within a substrate and the contrast of the alignment markers within the substrate is different from each other. For example, even in the case of carrying out laser irradiation on a multilayer film formed by sequentially stacking an amorphous silicon film serving as a peeling layer, a silicon oxide film for protecting a semiconductor film during a peeling step, and a semiconductor film (polycrystalline silicon film) with alignment markers formed, the position of a beam spot can be aligned at the predetermined position.

Since the irradiation position of the laser beam can be adjusted by moving the laser oscillator by any distance along the supporters 241 and 242 in the laser irradiation apparatus of this embodiment mode, the linear beams 161, 162, 163, and 164 can be easily adjusted to the irradiation starting positions, respectively. Here, the stages 201, 202, 203, and 204 provided on the table 211 can be moved only in the Y-axis direction; however, the present invention is not limited to this, and the stages may be moved in the X-axis direction or a Z-axis direction, in addition to the Y-axis direction. Alternatively, the stages may be rotated in addition to the movement in the Y-axis direction, or may be moved in directions where these are combined appropriately.

Next, the X-axis stage 102 which can move at a speed of about 100 to 1000 mm/sec is moved at appropriate speed in the X-axis direction, thereby irradiating the irradiation body 101 with the linear beam. In this embodiment mode, the stage 102 provided with the irradiation body can be moved only in the X-axis direction; however, the present invention is not limited to this, and any structure is applicable as long as the irradiation position of the laser beam comes to a preset irradiation position. In other words, the stage may be moved in a Y-axis direction or a Z-axis direction or may be rotated, in addition to the movement in the X-axis direction. Alternatively, the stage may be moved in directions where these are combined appropriately.

After moving the X-axis stage 102 in the X-axis direction, the four Y-axis stages 201, 202, 203, and 204 are moved in the Y-axis direction by the same distance as the width of each crystal region obtained by crystallization with the use of the linear beams 161, 162, 163, and 164. After moving the Y-axis stages 201, 202, 203, and 204, the X-axis stage 102 is moved in the opposite direction, i.e. the −X-axis direction. In this embodiment mode, after the X-axis stage 102 is moved in the X-axis direction, each laser oscillator is moved in the Y-axis direction by different distance from each other; therefore, the adjacent linear beams emitted from the same laser oscillator are arranged with almost no space therebetween, allowing the surface of the substrate to be irradiated homogeneously. By repeating this operation, the whole surface of the substrate can be irradiated with the linear beam. At this time, by using the stages which move independently on the same axis as the Y-axis stages 201, 202, 203, and 204, the apparatus area can be made small. A stage driven by a linear motor or the like is given as the stage enabling such a thing.

By using the laser irradiation apparatus of this embodiment mode, it is possible to adjust the irradiation positions of the linear beams only by moving the laser oscillator, in the case of matching the irradiation position of the linear beam to the predetermined position. Simply moving the Y-axis stage makes it possible to move the laser oscillator and the optical system together. Therefore, it is no longer necessary to carry out difficult optical alignment, which makes it possible to adjust the irradiation position of the linear beam very easily. Thus, the time required for maintenance can be drastically shortened and the productivity can be increased. Since the irradiation position can be adjusted by moving the laser oscillator, the laser irradiation position can be finely adjusted. Therefore, the formation of a region not irradiated with the laser beam or a region irradiated with the laser beam multiple times can be avoided. By applying the laser irradiation apparatus of this embodiment mode to crystallize a semiconductor film in manufacturing TFTs, the productivity and yield of TFTs can be increased.

Embodiment Mode 2

This embodiment mode will describe a structure of a laser irradiation apparatus for determining an irradiation position of a linear beam with one CCD camera instead of the four CCD cameras used in Embodiment Mode 1. However, since the present invention can be embodied in many different modes, it is easily understood by those skilled in the art that the mode and detail can be variously changed without departing from the scope and spirit of the present invention. Therefore, the present invention should not be construed as being limited to the description of this embodiment mode. It is to be noted that this embodiment mode can be freely combined with another embodiment modes.

Figure 3:
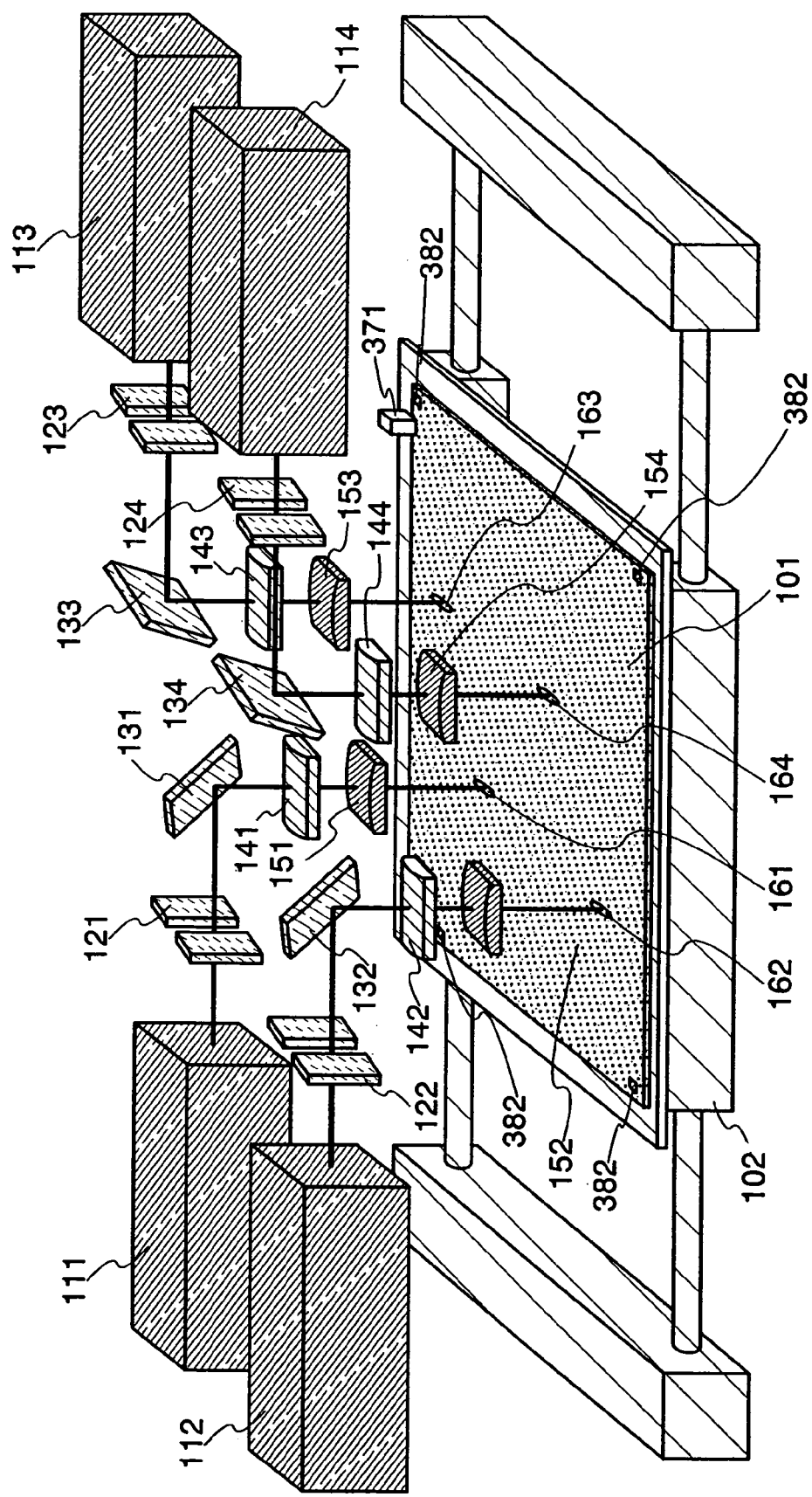
FIG. 3 shows a structure of a laser oscillator of the present invention.
Figure 4:
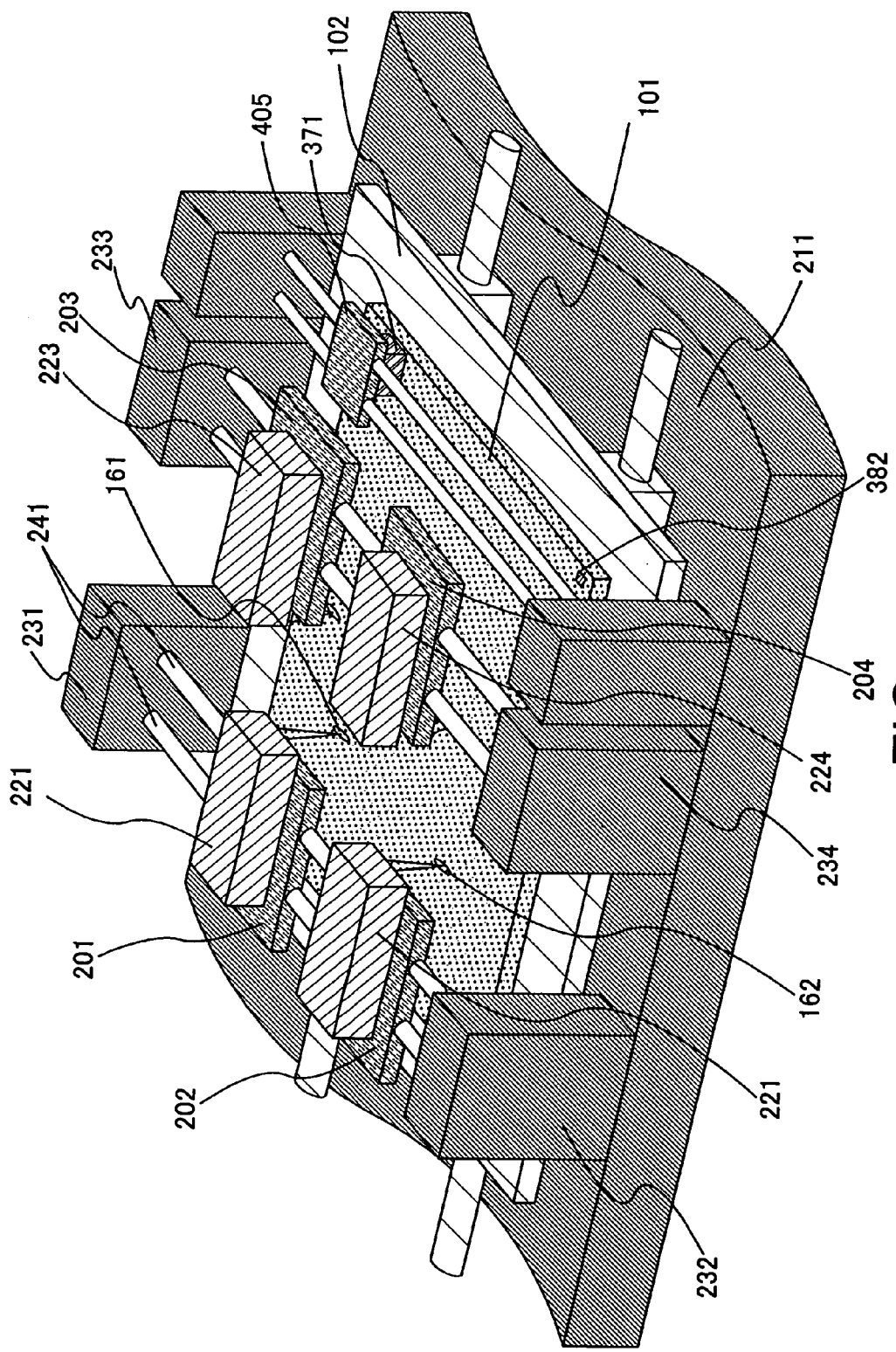
FIG. 4 shows a structure of a laser oscillator of the present invention.
Figure 5:
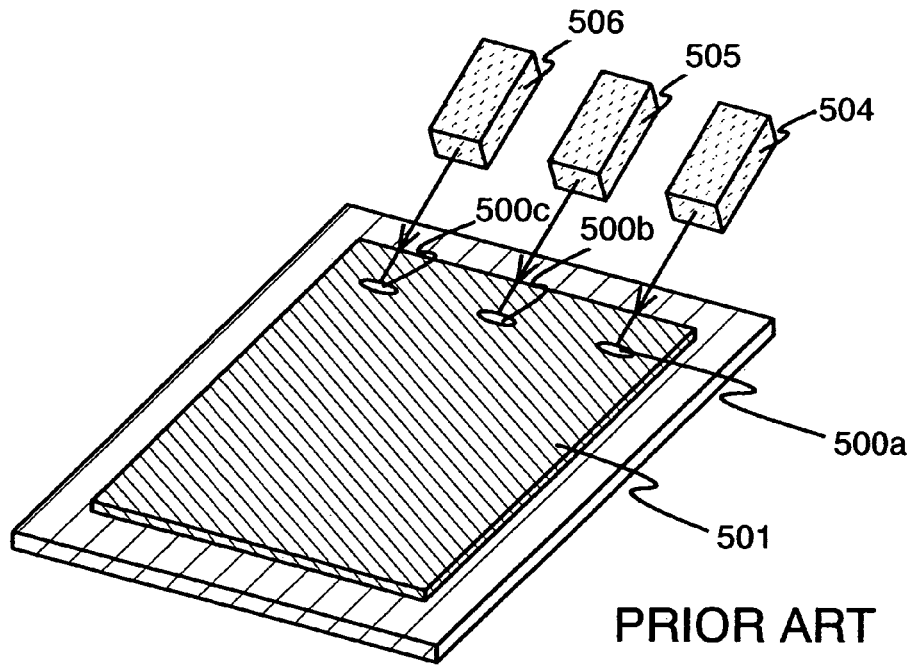
FIG. 5 shows a laser irradiation apparatus including three laser oscillators.
Figure 6:
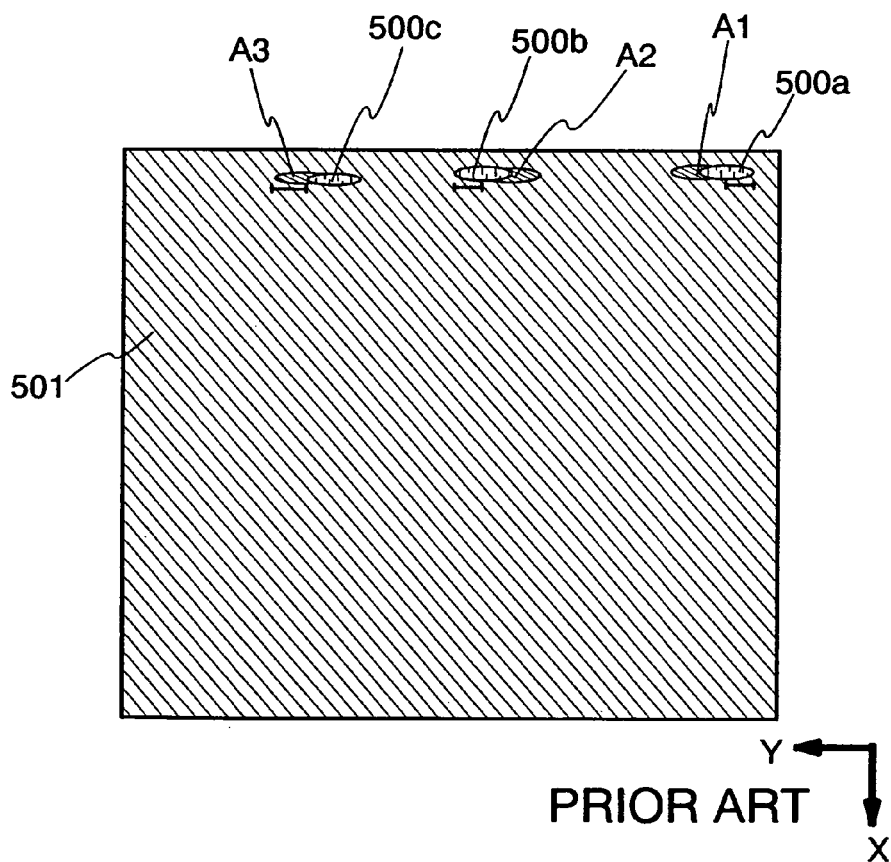
FIG. 6 shows laser irradiation using a laser irradiation apparatus including three laser oscillators.
Figure 7:
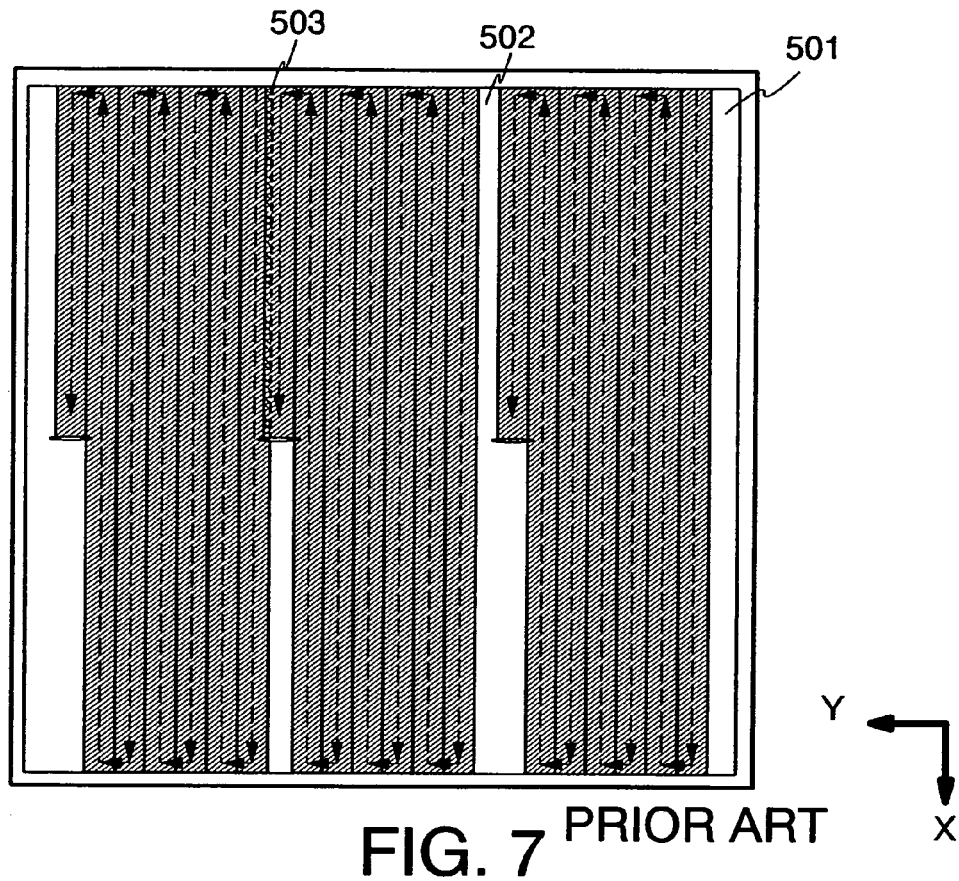
FIG. 7 shows laser irradiation using a laser irradiation apparatus including three laser oscillators.

A structure of a laser irradiation apparatus of this embodiment mode is shown in FIGS. 3 and 4. In this embodiment mode, four linear beams are aligned by moving one CCD camera. In other words, in the laser irradiation apparatus of this embodiment mode, a CCD camera 371 shown in FIGS. 3 and 4 and a Y-axis stage 405 shown in FIG. 4 for moving the CCD camera 371 are provided instead of the CCD cameras 171 to 174 shown in FIGS. 1 and 2. In this embodiment mode, the same parts as those in Embodiment Mode 1 are denoted with the same reference numerals and the description to such parts is omitted.

Here, the position of an alignment marker 382 serving as a reference point of an irradiation position of each linear beam which is formed at four corners on an irradiation body is detected by moving the CCD camera 371 provided with the Y-axis stage 405 which is different from the Y-axis stages 201, 202, 203, and 204 provided with four laser oscillators. The alignment markers 382 serves as a reference point of the irradiation position of each linear beam.

By using the laser irradiation apparatus of this embodiment mode, it is no longer necessary to carry out difficult optical alignment to adjust the irradiation position of the linear beams, which makes it possible to adjust the irradiation position of the linear beam very easily. Thus, the time required for maintenance can be drastically shortened and the productivity can be increased. Moreover, the laser irradiation position can be finely adjusted, and the formation of a region not irradiated with the laser beam or a region irradiated with the laser beam multiple times can be avoided. By applying the laser irradiation apparatus of this embodiment mode to crystallize a semiconductor film in manufacturing TFTs, the productivity and yield of TFTs can be increased.

Embodiment Mode 3

This embodiment mode will describe steps of manufacturing a thin film transistor (TFT) using the laser irradiation apparatuses shown in FIGS. 1 and 2. Although this embodiment mode will show a method for manufacturing a top-gate (staggered) TFT, the present invention can be applied not only to the top-gate TFT but also a bottom-gate (inverted staggered) TFT and the like. Since the present invention can be embodied in many different modes, it is easily understood by those skilled in the art that the mode and detail can be variously changed without departing from the scope and spirit of the present invention. Therefore, the present invention should not be construed as being limited to the description of this embodiment mode. This embodiment mode can be freely combined with another embodiment modes.

Figure 9:
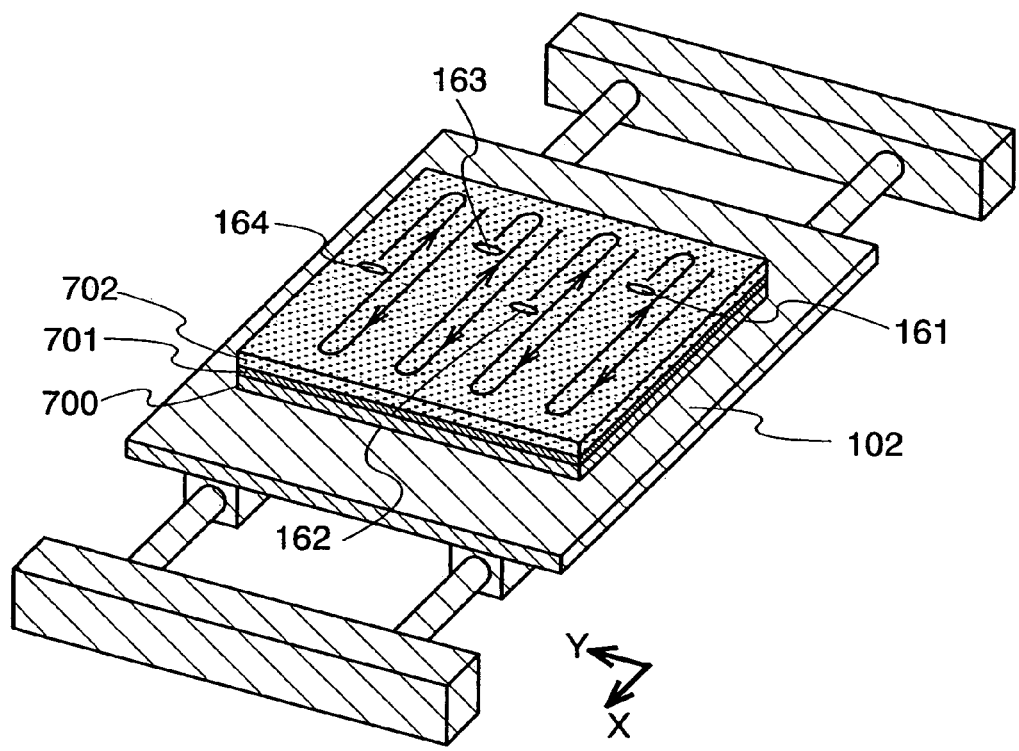
FIG. 9 shows laser irradiation using a laser oscillator of the present invention.

FIG. 9 shows the X-axis stage 102 of FIGS. 1 and 2. The X-axis stage 102 has a suction function and can be moved in the X-axis direction. First, as shown in FIG. 9, an insulating substrate 700 having an insulating surface, over which a base film 701 and an amorphous semiconductor film 702 are sequentially formed, is provided over the X-axis stage 102 having a suction function. As the insulating substrate 700, for example, a glass substrate made of barium borosilicate glass, aluminoborosilicate glass, or the like, a quartz substrate, a stainless steel substrate, or the like can be used. Moreover, a substrate formed with synthetic resin having flexibility, such as acrylic or plastic typified by PET, PES, or PEN generally tends to have lower heat resistance than other substrates; however, the substrate can be used as long as the substrate can withstand process temperature in the manufacturing steps.

The base film 701 is formed in order to prevent alkali earth metal or alkali metal such as Na contained in the insulating substrate 700 from diffusing into the semiconductor film. When alkali metal or alkali earth metal exists in the semiconductor film, such metal adversely affects the characteristic of a semiconductor element. Therefore, the base film 701 is formed with an insulating film such as silicon oxide, silicon nitride, silicon oxide containing nitrogen, or silicon nitride containing oxygen, which can suppress the diffusion of alkali metal and alkali earth metal into the semiconductor film. For example, a silicon nitride oxide film is formed with a thickness from 10 to 400 nm by a plasma CVD method. In the case of using a substrate containing even a small amount of alkali metal or alkali earth metal, such as a glass substrate or a plastic substrate, it is effective to provide a base film in point of preventing the diffusion of impurities; however, the base film is not necessarily provided when the diffusion of impurities does not lead to any significant problems, like in the case of using a quartz substrate.

The amorphous semiconductor film 702 with a thickness of approximately 25 to 100 nm (preferably 30 to 60 nm) is formed over the base film 701. As the amorphous semiconductor film, silicon or silicon containing germanium can be used. In the case of using silicon containing germanium, the concentration of germanium preferably ranges from about 0.01 to 4.5 atomic %. Subsequently, the amorphous semiconductor film 702 is crystallized using the laser irradiation apparatus of the present invention.

Figure 10:
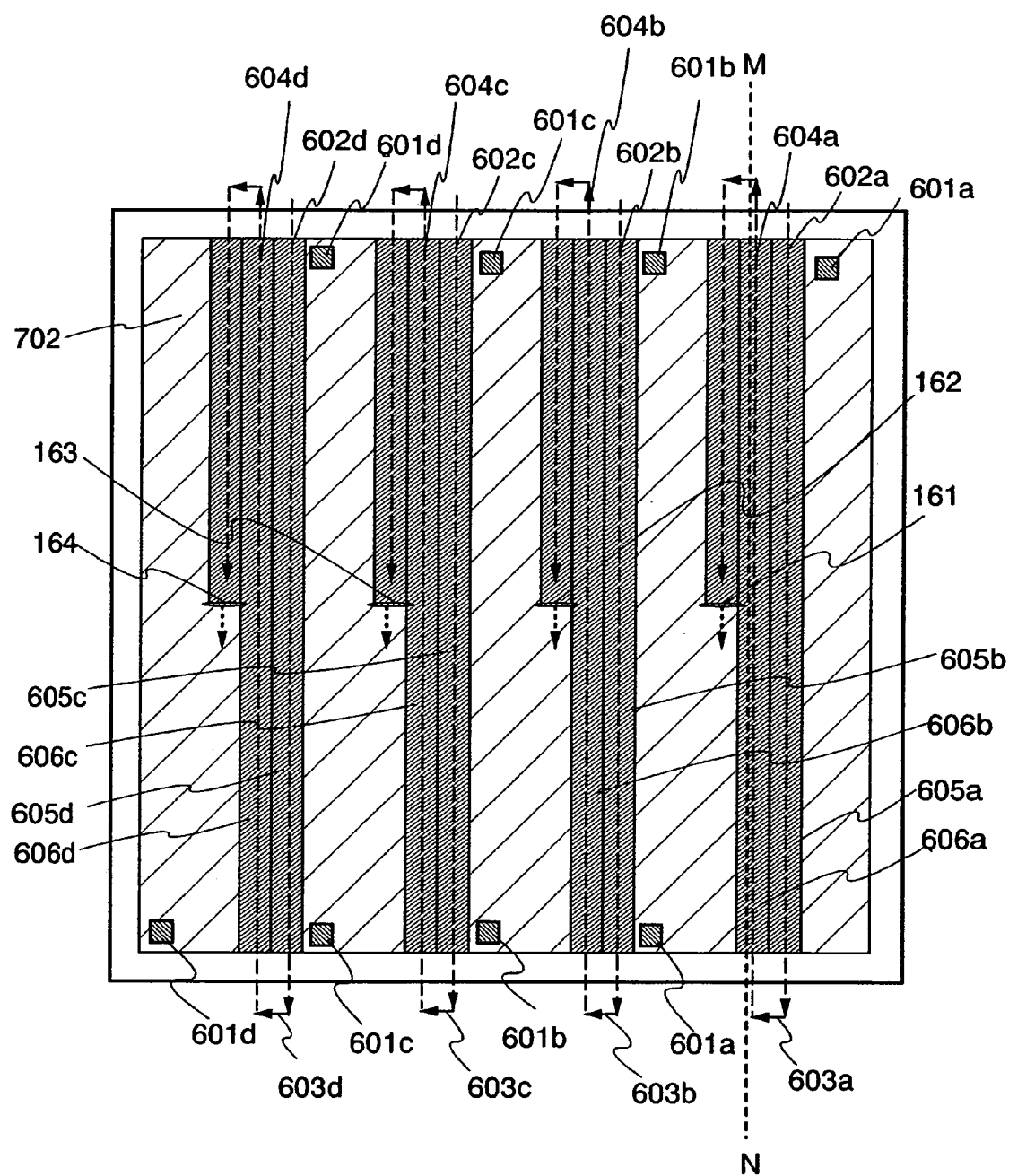
FIG. 10 shows laser irradiation using a laser oscillator of the present invention.

FIG. 10 is a schematic top view showing the amorphous semiconductor film 702. On the amorphous semiconductor film 702 formed over the base insulating film 701, alignment markers 601a, 601b, 601c, and 601d are formed in advance by a photolithography method. The alignment markers 601a, 601b, 601c, and 601d are formed by the semiconductor film and the alignment marker 601a is used for adjusting irradiation positions of the linear beam 161. Similarly, the other alignment markers 601b, 601c, and 601d correspond to the respective linear beams 162, 163, and 164. In this embodiment mode, the alignment markers are provided to determine the laser irradiation position; however, the alignment markers are not necessarily provided. Moreover, the alignment markers are formed by the semiconductor film in this embodiment mode: however, the alignment markers may be formed in the glass substrate.

In this embodiment mode, the laser irradiation apparatus having the four laser oscillators, the four sets of optical systems for forming linear beams, the four CCD cameras, the X-stage, and the four Y-axis stages described in FIGS. 1 and 2 are used. First, the laser beams emitted from the laser oscillators 111, 112, 113, and 114 are shaped into the linear beams 161, 162, 163, and 164 on the irradiation body by using the first optical system, the second optical system, the third optical system, and the fourth optical system (see FIG. 1). In this embodiment mode, the amorphous semiconductor film 702 corresponds to the irradiation body.

Next, the patterns of the alignment markers 601a, 601b, 601c, and 601d (see FIG. 10) formed by the amorphous semiconductor film 702 are taken into an image processing device (not shown) by the CCD cameras provided over the respective Y-axis stages. Then, pattern matching of the patterns taken into the image processing device by the CCD cameras and the patterns pre-registered in the image processing device is carried out to obtain the positional information of the respective alignment markers. Then, the X-axis stage 102 and the Y-axis stages 201, 202, 203, and 204 are moved based on the obtained positional information of the alignment markers to match the linear beams 161, 162, 163, and 164 to the irradiation positions on the semiconductor film 702.

As the laser oscillators, for example, four CW Nd:YVO$_4$ lasers each having 10 W output power and emitting a second harmonic can be used. The number of laser oscillators is not limited to this as long as the number is two or more. The output power of the laser oscillators may be different from each other. By using the laser oscillators with different output power, a semiconductor film having different crystallinity can be formed by one scan.

After aligning the linear beams, the respective linear beams are scanned at the same time in directions indicated by dotted-line arrows 602a, 602b, 602c, and 602d shown in FIG. 10, thereby forming crystal regions 605a, 605b, 605c, and 605d. At this time, the short-side directions of the linear beams are preferably parallel to the X-axis direction because the productivity is higher.

After forming the crystal regions 605a, 605b, 605c, and 605d by moving the X-axis stage in the X-axis direction, the Y-axis stages are moved to move the linear beams in directions indicated by arrows 603a, 603b, 603c, and 603d. At this time, the Y-axis stages are moved by the same distance as the width of the crystal regions 605a, 605b, 605c, and 605d so that the crystal regions 605a and 606a are formed with almost no space therebetween. After that, the linear beams are scanned at the same time in directions indicated by dotted-line arrows 604a, 604b, 604c, and 604d by the X-axis stage again, thereby forming crystal regions 606a, 606b, 606c, and 606d. In this embodiment mode, since the laser oscillators are moved in the Y-axis direction by the distance different from each other after being moved in the X-axis direction, the crystal region 605a and the crystal region 606a can be formed with almost no space therebetween. Similarly, it is possible to form the crystal regions 605b, 605c, and 605d, and the crystal regions 606b, 606c, and 606d with almost no space therebetween and to perform homogeneous irradiation over the substrate. By repeating this operation, it is possible to homogeneously and effectively crystallize the amorphous semiconductor film formed over the whole surface of the substrate by laser annealing. When stages which operate independently from each other are used as the Y-axis stages, the apparatus area can be made small. A stage driven by a linear motor is given as the stage enabling such a thing. Here, the X-axis direction is a direction along a short side of the linear beam, while the Y-axis direction is a direction along a long side of the linear beam.

Figure 11A:
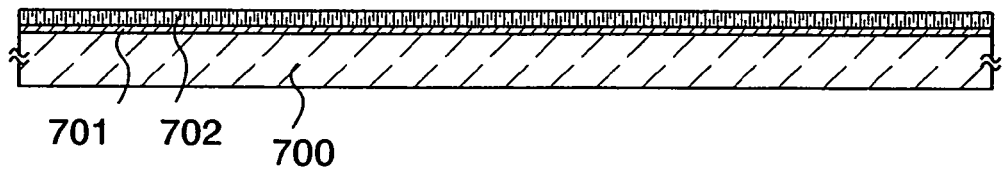
FIGS. 11A to 11D schematically show steps of manufacturing TFTs using laser oscillator of the present invention.
Figure 11B:
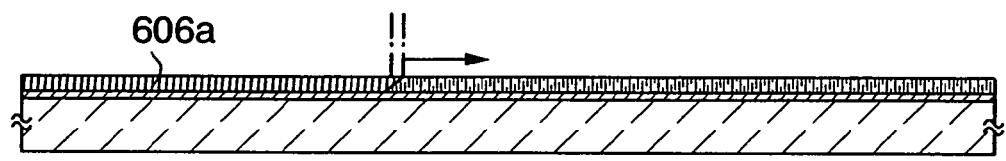

Next, manufacturing steps of TFTs is described with reference to FIGS. 11A to 11D. FIGS. 11A to 11D are cross-sectional views taken along a dotted line from M to N in FIG. 10. As shown in FIG. 11A, the base film 701 and the amorphous semiconductor film 702 are sequentially stacked over the insulating substrate 700. The linear beam is scanned on the surface of the amorphous semiconductor film 702 in a direction indicated by an arrow shown in FIG. 11B. By the irradiation with the linear beam, crystal grains grown continuously toward the scanning direction of the linear beam are formed. As described above, TFTs with almost no crystal grain boundaries in a direction where carriers move in a channel in the crystalline semiconductor film 606a can be formed by forming crystal grains extending long in the scanning direction of the linear beam.

Figure 11C:
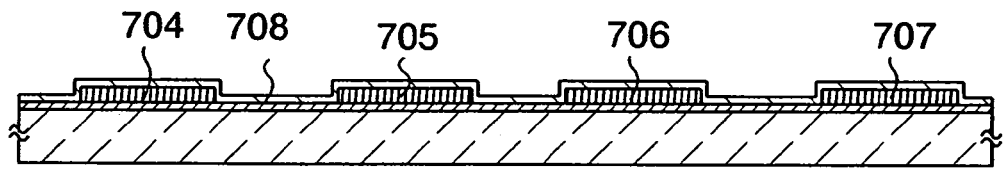

After that, the crystalline semiconductor film 606a is etched as shown in FIG. 11C, thereby forming island-shaped semiconductor films 704 to 707. By using the island-shaped semiconductor films 704 to 707, various semiconductor elements typified by TFTs are formed. Next, a gate insulating film 708 is formed so as to cover the island-shaped semiconductor films 704 to 707. The gate insulating film 708 can be formed with, for example, silicon oxide, silicon nitride, or silicon nitride oxide by a plasma CVD method, a sputtering method, or the like. For example, an insulating film containing silicon with a thickness of 30 to 200 nm may be formed by a sputtering method.

Figure 11D:
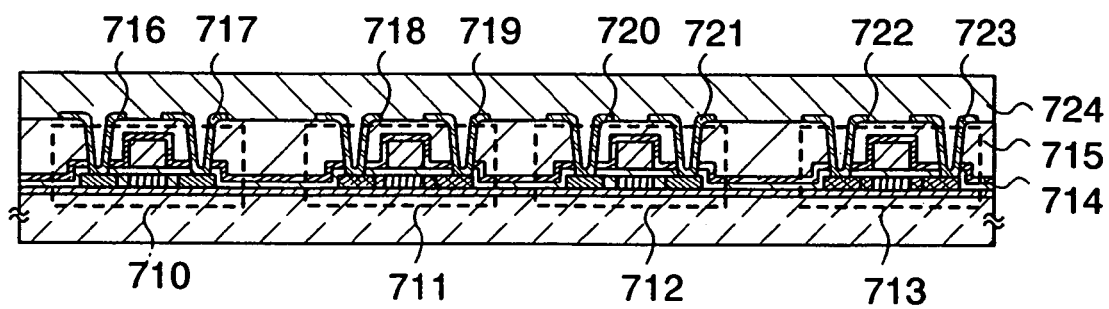

Next, a conductive film is formed over the gate insulating film and etched, thereby forming a gate electrode. After that, impurities imparting an n-type or p-type conductivity type are selectively added into the island-shaped semiconductor films 704 to 707 by using the gate electrode or an etched resist as a mask, thereby forming a source region, a drain region, an LDD region, and the like. By the above-mentioned steps, N-type transistors 710 and 712, and P-type transistors 711 and 713 can be formed over one substrate (FIG. 11D). Subsequently, an insulating film 714 is formed to protect those transistors. This insulating film 714 may be formed in a single-layer structure or a multilayer structure with an insulating film containing silicon of 100 to 200 nm thick by a plasma CVD method or a sputtering method. For example, a silicon oxynitride film of 100 nm thick may be formed by a plasma CVD method.

An organic insulating film 715 is formed over the insulating film 714. The organic insulating film 715 is formed with an organic insulating film such as polyimide, polyamide, BCB, or acrylic applied by an SOG method. The insulating film 715 is preferably formed with a film superior in flatness because the insulating film 715 is formed mainly with a purpose of relaxing and flattening the unevenness due to TFTs formed over the glass substrate 700. Moreover, by a photolithography method, the insulating film 714 and the organic insulating film 715 are patterned to form a contact hole therein that reaches the impurity region.

Next, a conductive film is formed with a conductive material and patterned, thereby forming wirings 716 to 723. After that, an insulating film 724 is formed as a protective film, thereby completing a semiconductor device shown in FIG. 11D. The method for manufacturing a semiconductor device using a laser annealing method of the present invention is not limited to the above-mentioned manufacturing steps of TFTs described above. In the present invention, the crystalline semiconductor film obtained by the laser irradiation method is used as an active layer of a TFT. Accordingly, it is possible to suppress the variation in mobility, threshold, and on-current between the elements. The irradiation condition of the laser beam is not limited to that shown in this embodiment mode.

A crystallization step using a catalytic element may be provided before the crystallization using the laser beam. As the catalytic element, nickel (Ni), germanium (Ge), iron (Fe), palladium (Pd), tin (Sn), lead (Pb), cobalt (Co), platinum (Pt), copper (Cu), or gold (Au) can be used. In this case, the laser irradiation melts an upper part of the semiconductor film but does not melt a lower part thereof. Therefore, a crystal remaining without being melted in the lower part of the semiconductor film becomes a crystal nucleus and the crystallization is promoted from the lower part toward the upper part of the semiconductor film.

Therefore, as compared with the case of conducting only a crystallization step by the laser beam, the crystallinity of the semiconductor film can be enhanced further and the roughness of the surface of the semiconductor film after the crystallization by the laser beam can be suppressed. Thus, the variation in the characteristic between semiconductor elements to be formed afterward, typically TFTs, can be suppressed further, and the off-current can be suppressed. It is noted that the crystallization may be performed in such a way that the heat treatment is performed after the catalyst element is added in order to promote the crystallization and that the laser irradiation is performed in order to enhance the crystallinity further. Alternatively, the heat treatment may be omitted. Specifically, after adding the catalyst element, the semiconductor film may be irradiated with the laser beam instead of the heat treatment so as to enhance the crystallinity.

Although this embodiment mode has shown the example of using the laser irradiation method of the present invention to crystallize the semiconductor film, the laser irradiation method of the present invention may be applied to activate an impurity element added in the semiconductor film. The method for manufacturing a semiconductor device using the present invention can be applied to manufacturing methods of an integrated circuit and a semiconductor display device. Transistors applied to a functional circuit such as a driver or a CPU preferably have an LDD structure or a structure in which an LDD overlaps a gate electrode. For higher-speed operation, transistors are preferably reduced in size. Since the transistors 710 to 713 completed by this embodiment mode have LDD structures, the transistors 710 to 713 are preferably used in a driver circuit requiring low Ioff value.

In this embodiment mode, since the plural linear beams are aligned by moving the laser oscillators, it is no longer necessary to carry out optical alignment to correct the displacement of the irradiation position of the linear beams, which makes it possible to adjust the irradiation position of each linear beam very easily. Thus, the time required for maintenance can be drastically shortened and the productivity can be increased. Since the irradiation position can be adjusted by moving the laser oscillator, the irradiation position of the linear beam can be finely adjusted. Therefore, the formation of a region not irradiated with the laser beam or a region irradiated with the laser beam multiple times can be avoided. By applying the method for manufacturing a TFT of this embodiment mode, the productivity and yield of TFTs can be increased.

Embodiment Mode 4

This embodiment mode will describe a process of manufacturing a thin film integrated circuit or a contactless thin film integrated circuit device (also referred to as a wireless chip, a wireless IC tag, or RFID (Radio Frequency IDentification)), by using the laser irradiation apparatuses shown in FIGS. 3 and 4. However, since the present invention can be carried out with many different modes, it is easily understood by those skilled in the art that the modes and details can be variously changed without departing from the scope and spirit of the present invention. Therefore, the present invention should not be construed as being limited to the description of this embodiment mode. This embodiment mode can be freely combined with another embodiment modes.

Although electrically-isolated TFTs are shown as semiconductor elements to be used in an integrated circuit of a wireless IC tag in the following example, the semiconductor elements used in an integrated circuit of a wireless IC tag are not limited to TFTs, but any kinds of semiconductor elements can be used. For example, a storage element, a diode, a photoelectric conversion element, a resistor element, a coil, a capacitor element, an inductor, and the like are typically given in addition to a TFT.

Figure 12:
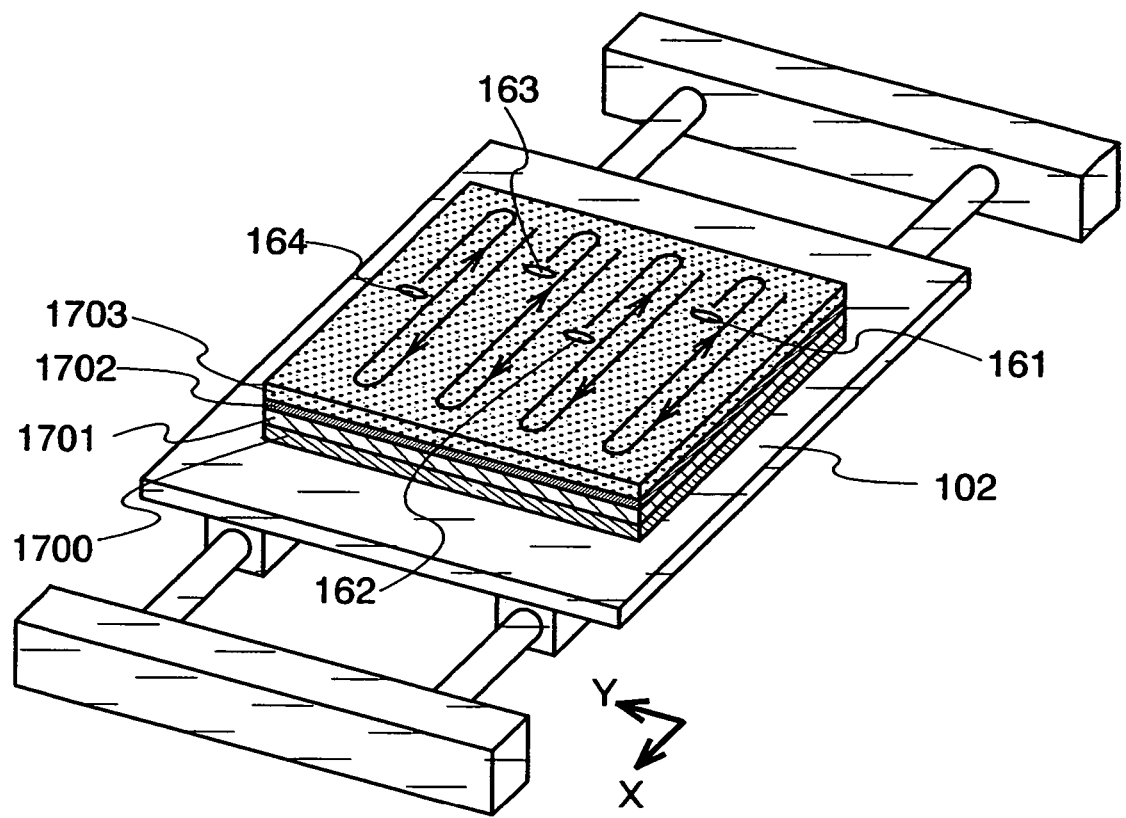
FIG. 12 shows laser irradiation using a laser oscillator of the present invention.

FIG. 12 shows the X-axis stage 102 shown in FIGS. 3 and 4. The X-axis stage 102 has a suction function and can be moved in a direction along the X-axis. As shown in FIG. 12, a glass substrate (first substrate) 1700 over which a peeling layer 1701, a base insulating film 1702, and a semiconductor film 1703 are sequentially formed is set over the X-axis stage. Steps up to forming the semiconductor film 1703 are described below.

First, the peeling layer 1701 is formed over the glass substrate (first substrate) 1700 by a sputtering method. The peeling layer 1701 can be formed by a sputtering method, a low-pressure CVD method, a plasma CVD method, or the like. In this embodiment mode, the peeling layer 1701 is formed with amorphous silicon in approximately 50 nm thick by a sputtering method. The material of the peeling layer 1701 is not limited to silicon and a material which can be selectively etched away (such as W or Mo) may be used. The thickness of the peeling layer 1701 desirably ranges from 50 to 60 nm.

Next, the base insulating film 1702 is formed over the peeling layer 1701. The base insulating film 1702 is formed in order to prevent alkali earth metal or alkali metal such as Na included in the first substrate from diffusing into the semiconductor film. Alkali metal or alkali earth metal causes an adverse effect on semiconductor characteristics if such metal is in the semiconductor film. The base insulating film 1702 also has a role to protect semiconductor elements in a later step of peeling the semiconductor elements. The base insulating film 1702 may have a single-layer structure or a multilayer structure. Therefore, the base insulating film 1702 is formed with an insulating film which can suppress the diffusion of alkali metal and alkali earth metal, such as silicon oxide, silicon nitride, silicon oxide containing nitrogen (SiON), or silicon nitride containing oxygen (SiNO).

Next, the semiconductor film 1703 is formed over the base insulating film 1702. The semiconductor film 1703 is preferably formed without exposing the substrate to the air after forming the base insulating film 1702. The thickness of the semiconductor film 1703 is set in the range of 20 to 200 nm (desirably 40 to 170 nm, more desirably 50 to 150 nm).

Figure 13:
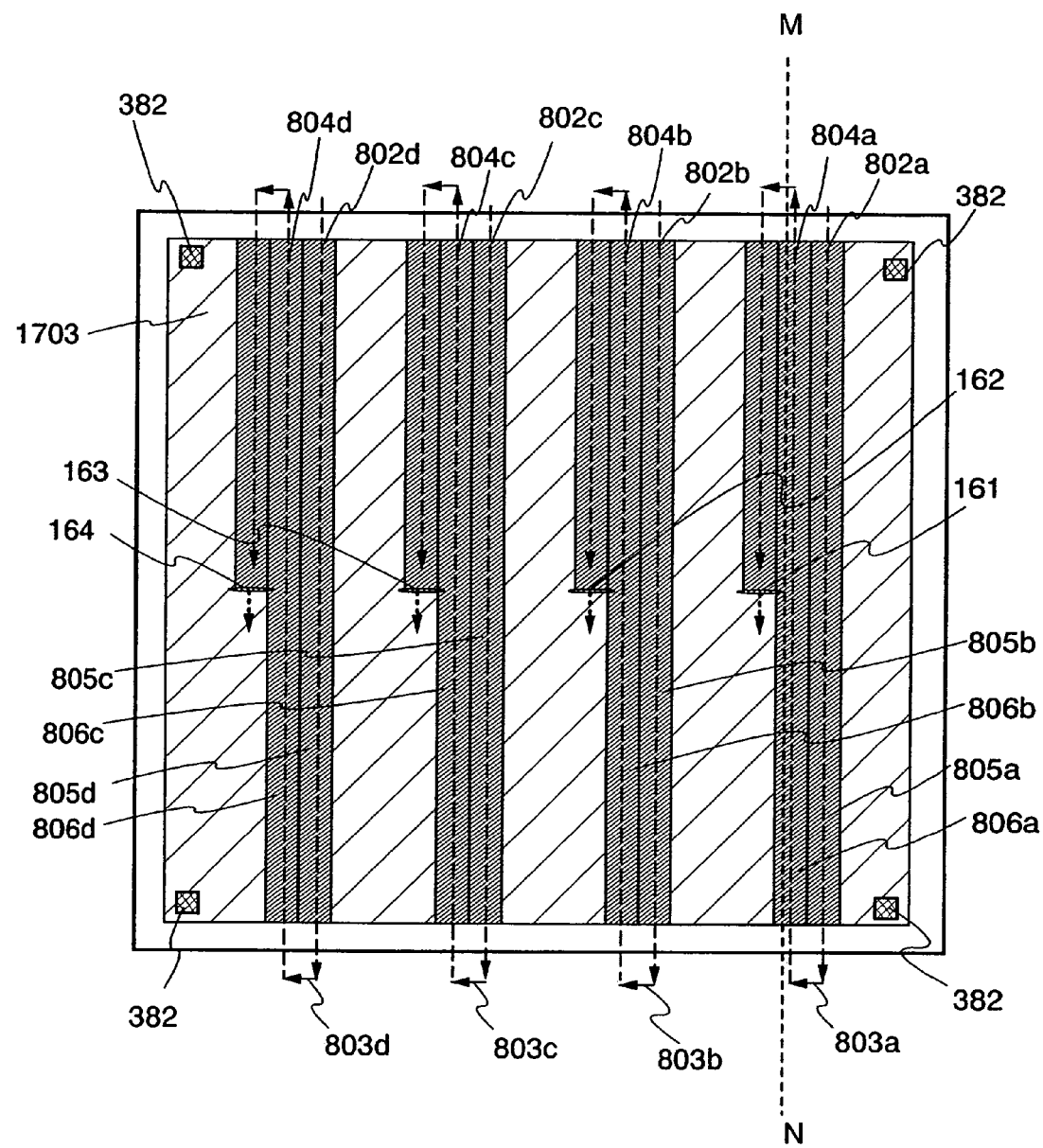
FIG. 13 shows laser irradiation using a laser oscillator of the present invention.

Then, the substrate manufactured through the above steps is set over the X-axis stage as shown in FIG. 12, and the semiconductor film 1703 is irradiated with linear beams by using the laser irradiation apparatus of the present invention, thereby crystallizing the semiconductor film 1703. FIG. 13 is a schematic view showing a surface of the semiconductor film 1703. After forming the semiconductor film 1703 over the base insulating film, the alignment markers 382 are formed in advance by a photolithography method before crystallizing the semiconductor film. The alignment markers 382 are formed by the semiconductor film, and the number thereof is two or more. By recording the alignment markers 382 with a CCD camera, the irradiation positions of the linear beams are determined. The alignment markers for determining the irradiation positions may be provided at any position on the semiconductor film. Instead of providing the alignment markers by the semiconductor film, the alignment markers may be formed within the glass substrate.

In this embodiment mode, the laser apparatus having the four laser oscillators, the four sets of optical systems for forming linear beams, the four CCD cameras, the X-stage, and the four Y-axis stages (see FIGS. 3 and 4) is used. First, laser beam emitted from the laser oscillators 111, 112, 113, and 114 are shaped into the linear beams 161, 162, 163, and 164 by using the first optical system, the second optical system, the third optical system, and the fourth optical system (see FIG. 3).

Next, the alignment markers 382 formed by the irradiation body are read by the CCD camera 371 provided over the Y-axis stage in FIG. 4 and taken in an image processing device (not shown). In this embodiment mode, the semiconductor film 1703 corresponds to the irradiation body. Then, pattern matching of the patterns taken into the image processing device with the CCD cameras and patterns pre-registered in the image processing device is carried out to obtain the positional information of the respective alignment markers. Then, the X-axis stage or the Y-axis stages 201, 202, 203, and 204 is/are moved based on the obtained positional information of the alignment markers to adjust the linear beams 161, 162, 163, and 164 onto the irradiation positions on the semiconductor film 1703.

As the laser oscillator, for example, four CW Nd:YVO$_4$ lasers each having 10 W output power and emitting a second harmonic can be used. The number of laser oscillators is not limited to four as long as the number is two or more. The output power of the laser oscillators may be different from each other. By using the laser oscillators with different output power, a semiconductor film having different crystallinity can be formed by one scan.

After aligning the linear beams, the X-axis stage is moved to scan the respective linear beams at the same time in directions indicated by dotted-line arrows 802a, 802b, 802c, and 802d shown in FIG. 13, thereby forming crystal regions 805a, 805b, 805c, and 805d. At this time, the short-side directions of the linear beams 161, 162, 163, and 164 are preferably parallel to the X-axis direction because the productivity is high.

After forming the crystal regions 805a, 805b, 805c, and 805d by scanning the X-axis stage in the X-axis direction, the Y-axis stages are moved to move the linear beams in directions indicated by arrows 803a, 803b, 803c, and 803d. At this time, the Y-axis stages are moved in accordance with the widths of the crystal regions 805a, 805b, 805c, and 805d. After that, the X-axis stage is moved at the same time in directions indicated by dotted-line arrows 804a, 804b, 804c, and 804d by the X-axis stage again, thereby forming crystal regions 806a, 806b, 806c, and 806d. By repeating these operation, it is possible to homogeneously and effectively crystallize the amorphous semiconductor film formed over the whole surface of the substrate by laser annealing. When stages which operate independently from each other are used as the Y-axis stages, the apparatus area can be made small. A stage driven by a linear motor is given as the stage enabling such a thing.

Figure 14A:
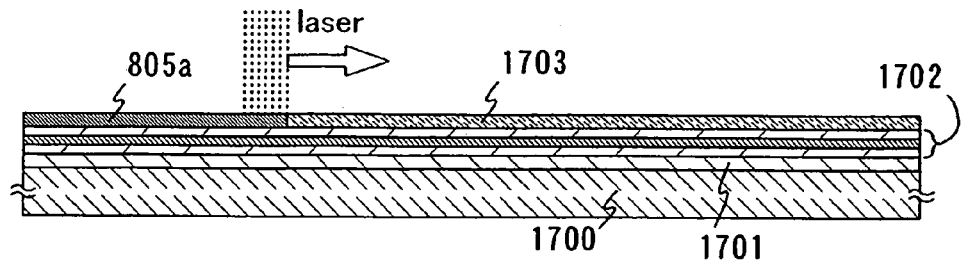
FIGS. 14A to 14E schematically show steps of manufacturing a semiconductor device using laser oscillator of the present invention.

Next, steps of manufacturing a thin film integrated circuit are described with reference to FIGS. 14A to 18B. FIG. 14A is a cross-sectional view taken along a dotted line connecting M and N in FIG. 13. As shown in FIG. 14A, the peeling layer 1701, the base insulating film 1702, and the semiconductor film 1703 are sequentially stacked over the first substrate 1700. Then, the semiconductor film 1703 is irradiated with the linear beam by using the laser irradiation apparatus of this embodiment mode, thereby forming the crystalline semiconductor film 805a (crystal region) (see FIG. 14A).

Figure 14B:
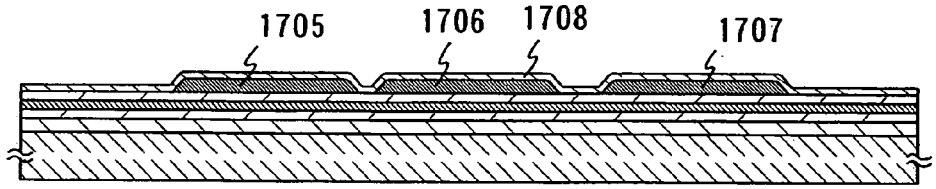

Next, as shown in FIG. 14B, a semiconductor film 805a having a crystal structure is etched to form island-shaped semiconductor layers 1705 to 1707, and then a gate insulating film 1708 is formed. The gate insulating film 1708 is formed with silicon nitride, silicon oxide, silicon oxide containing nitrogen, or silicon nitride containing oxygen in a single-layer structure or a multilayer structure by a plasma CVD method, a sputtering method, or the like.

After forming the gate insulating film 1708, a heat treatment at 300 to 450° C. for 1 to 12 hours may be performed in an atmosphere containing 3% or more of hydrogen to hydrogenate the island-shaped semiconductor films 1705 to 1707. As another means for the hydrogenation, plasma hydrogenation (using hydrogen excited in plasma) may be conducted.

Figure 14C:
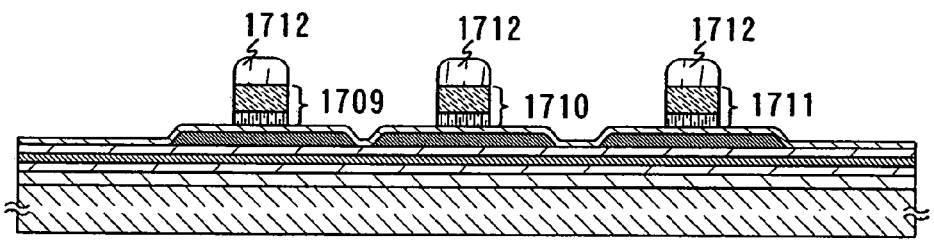

Next, as shown in FIG. 14C, gate electrodes 1709 to 1711 are formed as shown in FIG. 14C. Here, after stacking Si and W by a sputtering method, etching is conducted by using resist masks 1712 as masks, thereby forming the gate electrodes 1709 to 1711. The conductive material, structure, and manufacturing method of the gate electrodes 1709 to 1711 are not limited to these, and can be selected appropriately. For example, a multilayer structure including NiSi (nickel silicide) and Si doped with impurities imparting n-type conductivity (such as phosphorus or arsenic), or a multilayer structure including TaN (tantalum nitride) and W (tungsten) may be used. Moreover, a single layer structure using various conductive materials may be employed. In the case of forming the gate electrode and the antenna at the same time, the material may be selected in consideration of their functions.

A mask of silicon oxide or the like may be used instead of the resist mask. In this case, a step of forming a mask with silicon oxide, silicon oxide containing nitrogen, or the like (this mask is referred to as a hard mask) by etching is added; however, since the decrease in film thickness of the hard mask by the etching is less than that of a resist mask, the gate electrodes 1709 to 1711 with desired widths can be formed. Moreover, the gate electrodes 1709 to 1711 may be formed selectively by a droplet discharging method instead of using the resist 1712.

Figure 14D:
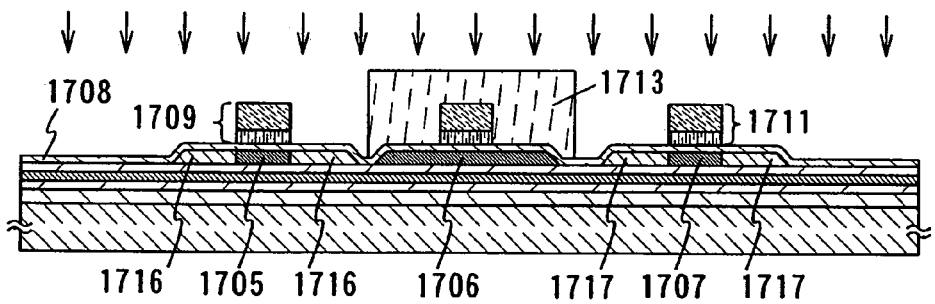

Next, as shown in FIG. 14D, the island-shaped semiconductor film 1706 to be a p-channel TFT is covered with a resist mask 1713, and the island-shaped semiconductor films 1705 and 1707 are doped with an impurity element imparting n-type conductivity (typified by P (phosphorus) or As (arsenic)) by using the gate electrodes 1709 and 1711 as masks. This doping step is conducted through the gate insulating film 1708 and a pair of low-concentration impurity regions 1716 and 1717 are formed in the island-shaped semiconductor films 1705 and 1707. This doping step may be conducted without covering the island-shaped semiconductor film 1706 to be a p-channel TFT with the resist mask 1713.

Figure 14E:
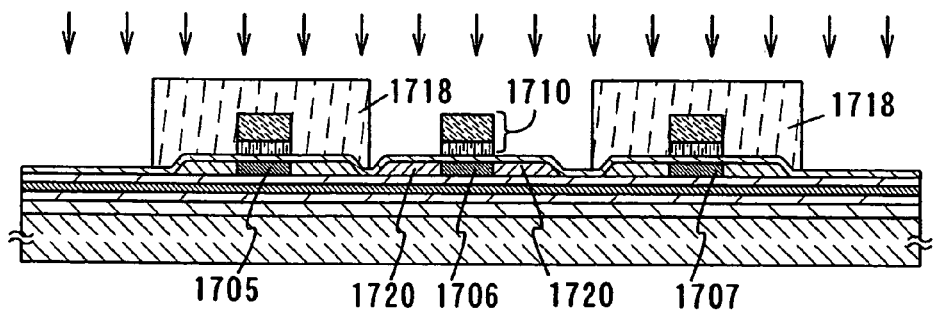

Next, as shown in FIG. 14E, after removing the resist mask 1713 by ashing or the like, resist masks 1718 are newly formed so as to cover the island-shaped semiconductor films 1705 and 1717 to be n-channel TFTs. By using the gate electrode 1710 as a mask, the island-shaped semiconductor film 1706 is doped with an impurity element imparting p-type conductivity (typically B (boron)) so that parts of the island-shaped semiconductor film 1706 becomes a high-concentration impurity region. This doping step is conducted through the gate insulating film 1708, thereby forming a pair of p-type high-concentration impurity regions 1720 in the island-shaped semiconductor film 1706.

Figure 15A:
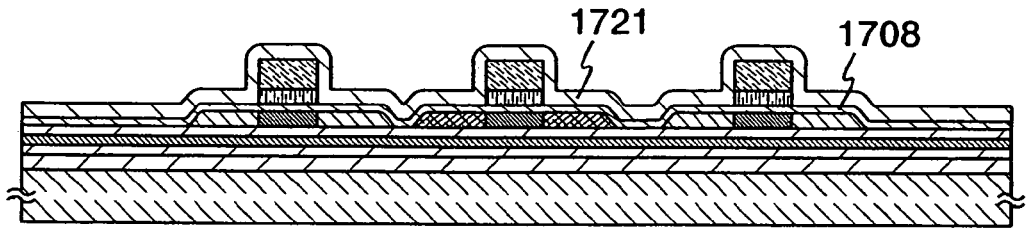
FIGS. 15A to 15C schematically show steps of manufacturing the semiconductor device using laser oscillator of the present invention.

Subsequently, as shown in FIG. 15A, after removing the resist masks 1718 by ashing or the like, an insulating film 1721 is formed so as to cover the gate insulating film 1708 and the gate electrodes 1709 to 1711.

Figure 15B:
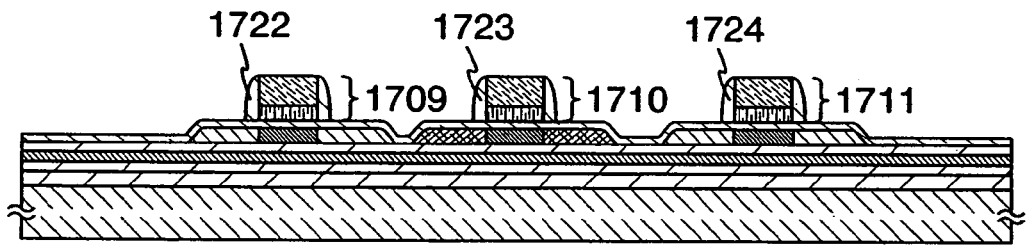

After that, the insulating film 1721 and the gate insulating film 1708 are partially etched by an etch-back method, thereby forming sidewalls 1722 to 1724 that are in contact with side walls of the gate electrodes 1709 to 1712 in a self-aligning manner as shown in FIG. 15B. As the etching gas, a mixed gas of $CHF_3$ and He is used. It is to be noted that the step of forming the sidewalls is not limited to this condition.

Figure 15C:
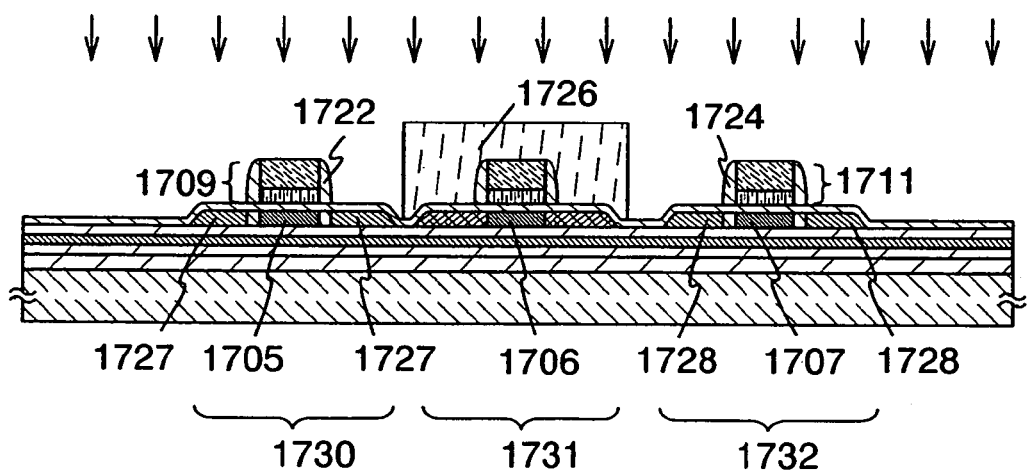

Next, as shown in FIG. 15C, a resist mask 1726 is newly formed so as to cover the island-shaped semiconductor film 1506 to be a p-channel TFT. By using the gate electrodes 1709 and 1711 and the sidewalls 1722 and 1724 as masks, an impurity element imparting n-type conductivity (typically P or As) is added so as to form high-concentration impurity regions: This doping step is conducted through the gate insulating film 1708, thereby forming a pair of n-type high-concentration impurity regions 1727 and 1728 in the island-shaped semiconductor films 1705 and 1707.

Next, after removing the resist mask 1726 by ashing or the like, the impurity regions may be thermally activated. For example, after forming a 50-nm-thick silicon oxide film containing nitrogen, a heat treatment may be conducted under a nitrogen atmosphere of 550° C. for four hours. Moreover, after forming a 100-nm-thick silicon nitride film containing hydrogen, a heat treatment may be conducted under a nitrogen atmosphere of 410° C. for one hour to decrease the defects in the polycrystalline semiconductor film. This is, for example, to terminate dangling bonds in the polycrystalline semiconductor film and referred to as a hydrogenation treatment step or the like.

By the above steps, an n-channel TFT 1730, a p-channel TFT 1731, and an n-channel TFT 1732 are formed. In the above manufacturing step, TFTs each having a LDD length of 0.2 to 2 μm can be formed by appropriately changing the condition of the etch-back method to adjust the size of the sidewall. Moreover, after that, a passivation film for protecting the TFTs 1730 to 1732 may be formed.

Figure 16A:
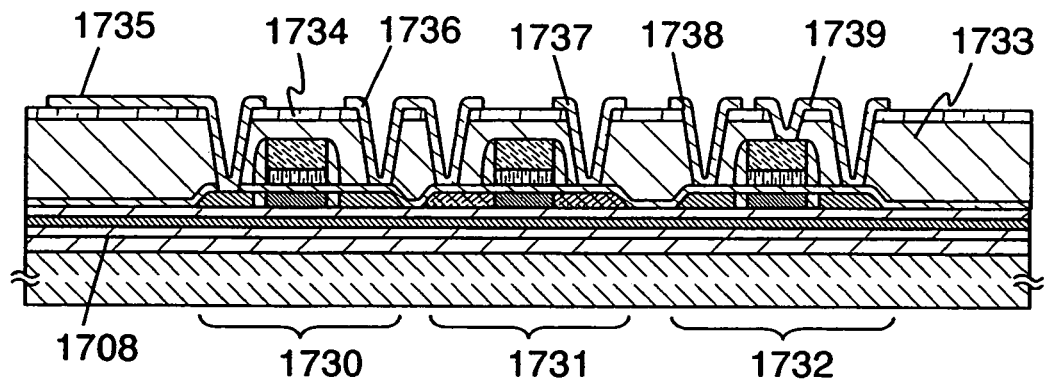
FIGS. 16A and 16B schematically show steps of manufacturing the semiconductor device using laser oscillator of the present invention.

Subsequently, as shown in FIG. 16A, a first interlayer insulating film 1733 is formed so as to cover the TFTs 1730 to 1732. Moreover, a second interlayer insulating film 1734 is formed over the first interlayer insulating film 1733. A filler may be mixed into the first interlayer insulating film 1733 or the second interlayer insulating film 1734 in order to prevent the first interlayer insulating film 1733 or the second interlayer insulating film 1734 from being peeled or cracked due to stress caused by a difference of coefficient of thermal expansion between the first interlayer insulating film 1733 or the second interlayer insulating film 1734 and a conductive material and the like for forming a wiring later.

Next, as shown in FIG. 16A, contact holes are formed in the first interlayer insulating film 1733, the second interlayer insulating film 1734, and the gate insulating film 1708, and then wirings 1735 to 1739 to be connected to the TFTs 1730 to 1732 are formed. The wirings 1735 and 1736 are connected to the high-concentration impurity regions 1727 of the n-channel TFT 1730, the wirings 1736 and 1737 are connected to the high-concentration impurity regions 1720 of the p-channel TFT 1731, and the wirings 1738 and 1739 are connected to the high-concentration impurity regions 1728 of the n-channel TFT 1732, respectively. The wiring 1739 is also connected to the gate electrode 1711 of the n-channel TFT 1732. The n-channel TFT 1732 can be used as a memory element of a random ROM.

Figure 16B:
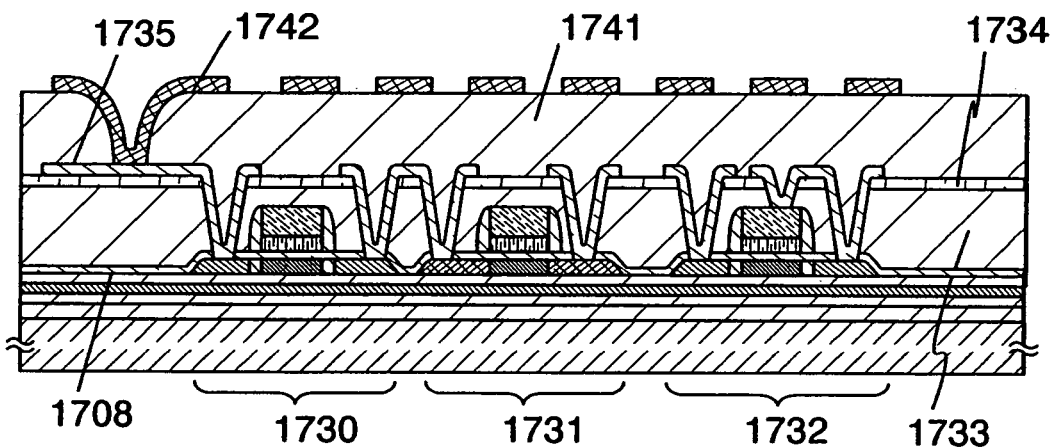

Next, as shown in FIG. 16B, a third interlayer insulating film 1741 is formed over the second interlayer insulating film 1734 so as to cover the wirings 1735 to 1739. The third interlayer insulating film 1741 is formed so as to have an opening portion at a position where the wiring 1735 is partially exposed. The third interlayer insulating film 1741 can be formed with the similar material to the first interlayer insulating film 1733.

Next, an antenna 1742 is formed over the third interlayer insulating film 1741. The antenna 1742 is formed with a conductive material including one or more of the following metal or one or more of metal compounds containing the following metal: Ag, Au, Cu, Pd, Cr, Mo, Ti, Ta, W, Al, Fe, Co, Zn, Sn, Ni, or the like. The antenna 1742 is connected to the wiring 1735. In FIG. 16B, the antenna 1742 is directly connected to the wiring 1735; however, the wireless IC tag of the present invention is not limited to this structure. For example, by using a separately-formed wiring, the antenna 1742 may be electrically connected to the wiring 1735.

The antenna 1742 can be formed by a photolithography method, an evaporation method, a droplet discharging method, or the like. In FIG. 16B, the antenna 1742 is formed with a single conductive film; however, the antenna 1742 can be formed by stacking a plurality of conductive films. For example, the antenna 1742 may be formed by coating a Ni wiring or the like with Cu by electroless plating. The droplet discharging method is a method in which a predetermined pattern is formed by discharging a droplet containing a predetermined composition from a small nozzle, and includes an ink-jet method and the like in its category. The printing method includes a screen printing method, an off-set printing method, and the like. By using a printing method or a droplet discharging method, the antenna 1742 can be formed without using a mask for light-exposure. Moreover, a droplet discharging method and a printing method does not waste materials which are to be etched away in a photolithography method. Since an expensive mask for light-exposure is not necessary, the cost spent on the manufacturing of wireless IC tags can be suppressed.

In the case of using a droplet discharging method or various printing methods, for example, a conductive particle like Cu coated with Ag can also be used. If the antenna 1742 is formed by a droplet discharging method, it is desirable to perform a treatment for enhancing the adhesiveness of the antenna 1742 to the surface of the third interlayer insulating film 1741. As a method for enhancing the adhesiveness, specifically, a method in which metal or a metal compound which can enhance the adhesiveness of a conductive film or an insulating film by a catalytic action is attached to the surface of the third interlayer insulating film 1741, a method in which an organic insulating film, metal, or a metal compound which has high adhesiveness with respect to a conductive film or an insulating film to be formed is attached to the surface of the third interlayer insulating film 1741, a method in which surface modification is carried out through a plasma treatment to the surface of the third interlayer insulating film 1741 under atmospheric pressure or low pressure.

If the metal or the metal compound to be attached to the third interlayer insulating film 1741 has a conductive property, sheet resistance thereof is controlled so that normal operation of the antenna is not interrupted. Specifically, the average thickness of the metal or the metal compound having a conductive property may be controlled so as to range from, for example, 1 to 10 nm, or the metal or the metal compound may be insulated wholly or partially by oxidation. Alternatively, the attached metal or metal compound may be selectively etched away except for a region where the adhesiveness is to be increased. Moreover, the metal or the metal compound may be selectively attached only a particular region by a droplet discharging method, a printing method, a sol-gel method, or the like instead of attaching the metal or the metal compound in advance to the whole surface of the substrate. The metal or the metal compound is not necessarily a completely continuous film shape, and may be dispersed to some extent.

Figure 17A:
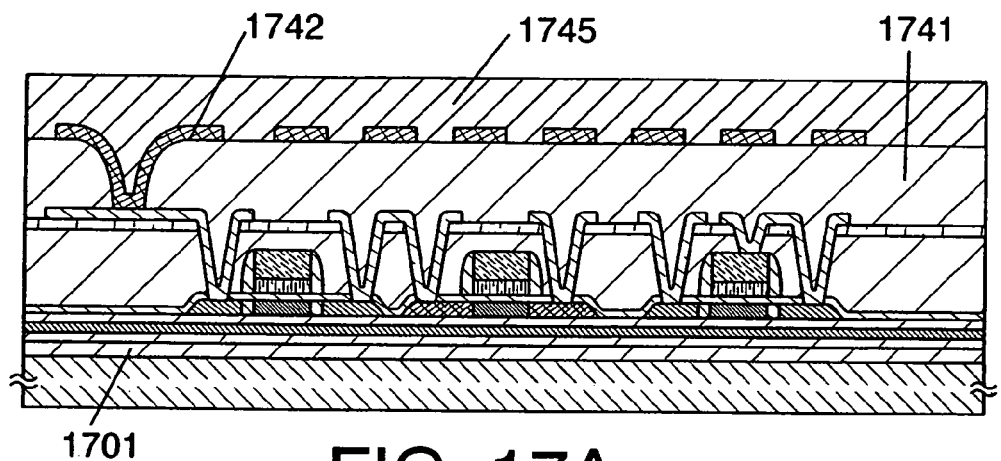
FIGS. 17A to 17C schematically show steps of manufacturing the semiconductor device using laser oscillator of the present invention.

Then, as shown in FIG. 17A, after forming the antenna 1742, a protective layer 1745 is formed over the third interlayer insulating film 1741 so as to cover the antenna 1742. The protective layer 1745 is formed with a material which can protect the antenna 1742 when the peeling layer 1701 is etched away later. For example, the protective layer 1745 can be formed by applying a resin of a silicon type, an acrylate type, or an epoxy type which can be dissolved in water or alcohols.

Figure 17B:
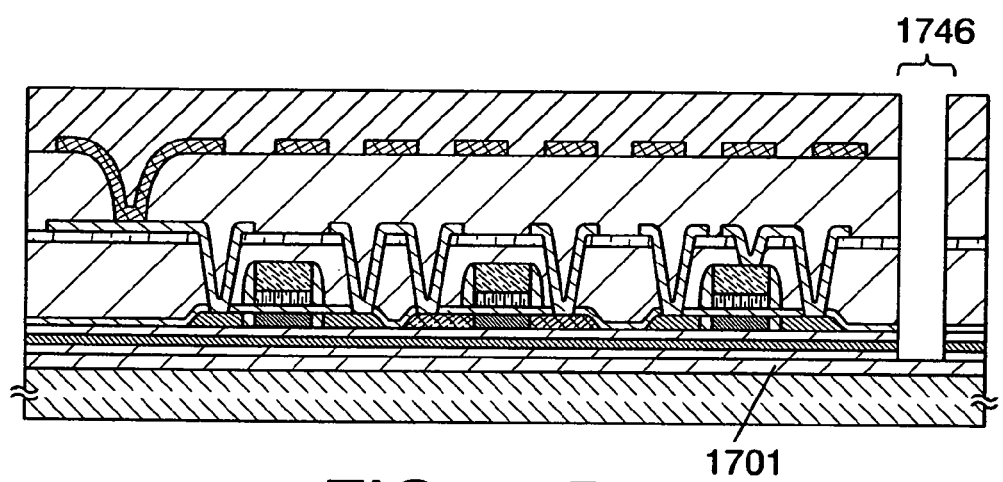

Subsequently, as shown in FIG. 17B, a groove 1746 is formed so as to separate the respective wireless IC tags. The groove 1746 may have the depth such that the peeling layer 1701 is exposed. The groove 1746 can be formed by dicing, scribing, or the like. If it is not necessary to separate the wireless IC tags formed over the first substrate 1700, the groove 1746 is not necessarily formed.

Figure 17C:
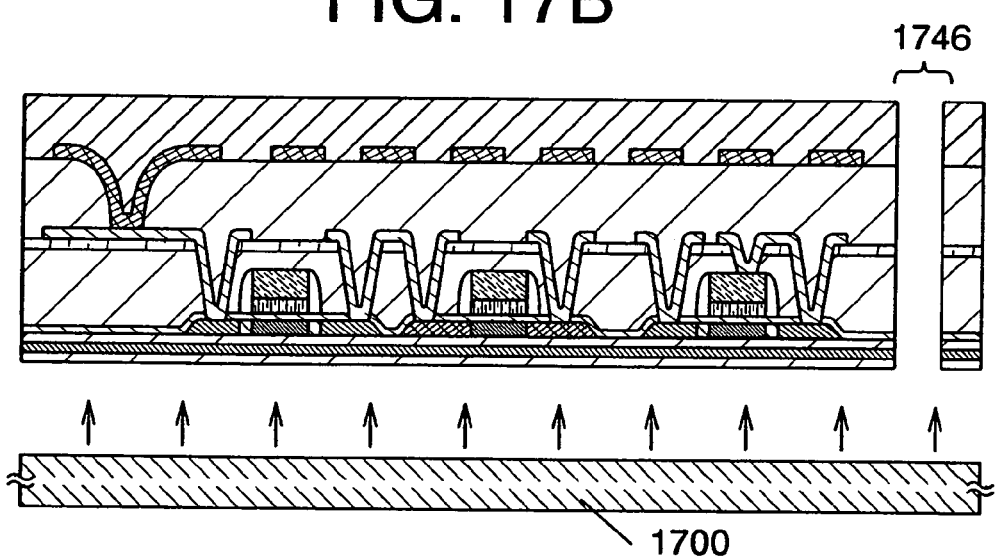

Next, as shown in FIG. 17C, the peeling layer 1701 is etched away. Here, halogen fluoride is used as the etching gas, and this gas is introduced from the groove 1746. For example, $ClF_3$ (chlorine trifluoride) is used, and the etching is conducted at 350° C. with a flow rate of 300 sccm under a pressure of 798 Pa for three hours. Nitrogen may be mixed into the $ClF_3$ gas. By using halogen fluoride gas such as $ClF_3$, the peeling layer 1701 can be selectively etched, thereby peeling the first substrate 1700 from the TFTs 1730 and 1732. The halogen fluoride may be either gas or liquid.

Figure 18A:
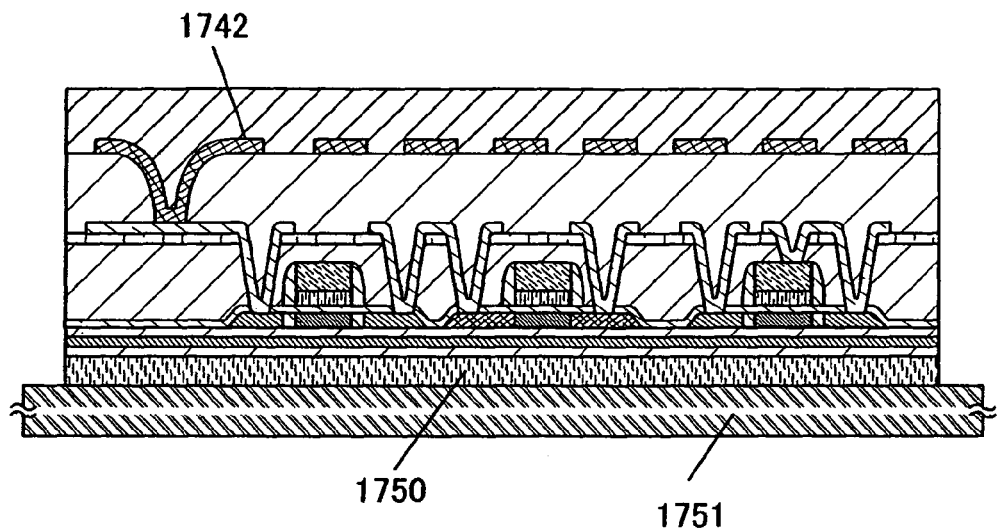
FIGS. 18A and 18B schematically show steps of manufacturing the semiconductor device using laser oscillator of the present invention.

Subsequently, as shown in FIG. 18A, the peeled TFTs 1730 to 1732 and the antenna 1742 are pasted to a second substrate 1751 by using an adhesive 1750. The adhesive 1750 is formed with a material that can paste the second substrate 1751 with the base insulating film 1702. As the adhesive 1750, for example, a reactive curable adhesive, a thermosetting adhesive, a photo curable adhesive such as a UV curable adhesive, an anaerobic adhesive, or the like can be used.

The second substrate 1751 can be formed with a paper or a flexible organic material such plastic.

Figure 18B:
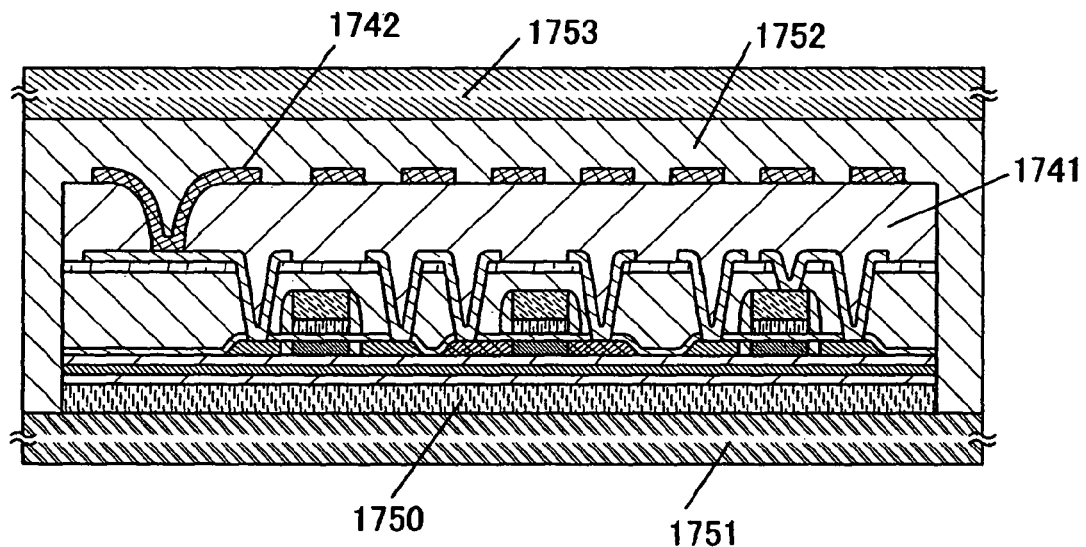

Next, as shown in FIG. 18B, after removing the protective layer 1745, an adhesive 1752 is applied onto the third interlayer insulating film 1741 so as to cover the antenna 1742, and a cover material 1753 is pasted. The cover material 1753 can be formed with a paper or a flexible organic material such as plastic, similarly to the second substrate 1751. The thickness of the adhesive 1752 may range from, for example, 10 to 200 μm.

The adhesive 1752 is formed with a material that can paste the cover material 1753 with the third interlayer insulating film 1741 and the antenna 1742. As the adhesive 1752, for example, a reactive curable adhesive, a thermosetting adhesive, a photo curable adhesive such as a UV curable adhesive, an anaerobic adhesive, or the like can be used.

By the above steps, the wireless IC tag is completed. In accordance with the above manufacturing method, an extremely thin integrated circuit with a thickness of 0.3 to 3 μm, typically about 2 μm, can be formed between the second substrate 1751 and the cover material 1753.

The thickness of the integrated circuit includes not only the thickness of the semiconductor element itself but also the thicknesses of the various insulating films and interlayer insulating films formed between the adhesive 1750 and the adhesive 1752. Moreover, the area of the integrated circuit in the wireless IC tag can be made 5 mm or less on each side (25 μm$^2$ or less), more desirably about 0.3 mm on each side (0.09 μm$^2$) to 4 mm on each side (16 μm$^2$).

Although this embodiment mode has shown the method for separating the substrate and the integrated circuit by etching away the peeling layer provided between the integrated circuit and the first substrate 1700 having high heat resistance, the method of manufacturing a wireless IC tag of the present invention is not limited to this. For example, a metal oxide film may be provided between the integrated circuit and the substrate having high heat resistance and this metal oxide film may be weakened by crystallization, so that the integrated circuit is peeled. Alternatively, a peeling layer using an amorphous semiconductor film containing hydrogen is provided between the integrated circuit and the substrate having high heat resistance and this peeling layer is removed by irradiation with a laser beam, so that the substrate and the integrated circuit are separated from each other. Moreover, the integrated circuit may be separated from the substrate by mechanically removing or etching away with the use of solution or gas from the substrate having high heat resistance with the integrated circuit formed.

Although this embodiment mode has shown the example of forming the antenna and the integrated circuit over one substrate, the present invention is not limited to this structure. The antenna and the integrated circuit may be formed over different substrates and may be electrically connected by being pasted to each other later.

Usually, RFID (Radio Frequency IDentification) often uses an electric wave frequency of 13.56 MHz or 2.45 GHz. Considering the enhancement of versatility, it is very important to form wireless IC tags so as to detect electric waves with these frequencies.

The wireless IC tag of this embodiment mode has advantages that an electric wave is difficult to be blocked as compared with an RFID tag formed using a semiconductor substrate and attenuation of signals due to the block of the electric wave can be prevented. Therefore, since semiconductor substrates are not necessary, the manufacturing cost of the wireless IC tag can be drastically decreased.

Although this embodiment mode has shown the example of peeling the integrated circuit and pasting the integrated circuit to the flexible substrate, the present invention is not limited to this structure. For example, in the case of using a substrate having high temperature which can withstand the heat treatment in the manufacturing steps of the integrated circuit in an IC tag, such as a glass substrate, it is not always necessary to peel the integrated circuit.

In this embodiment mode, since the irradiation positions of the plural linear beams are adjusted by moving the laser oscillators, it is no longer necessary to adjust the optical system to correct the displacement of the irradiation positions of the respective linear beams, thereby allowing easy adjustment of the irradiation positions of the respective linear beams. Therefore, the time required for maintenance can be drastically shortened, and the productivity can be increased. Moreover, since the irradiation position can be adjusted by moving the laser oscillators, the irradiation positions of the linear beams can be finely adjusted. Therefore, the formation of a region not irradiated with the laser beam and a region with the laser beam multiple times can be prevented. By using the manufacturing method of TFTs of this embodiment mode, the productivity and yield of TFTs can be increased.

Embodiment Mode 5

Since the whole surface of a substrate can be annealed homogeneously by the present invention, the productivity and degree of integration of semiconductor devices can be increased. Moreover, since laser beams with different output power can be irradiated onto one substrate at one scan, the degree of freedom in the layout, size and the integration of the semiconductor apparatus can be increased. Moreover, the degree of crystallization is the same in any part of the substrate irradiated with the same laser; therefore, the product quality of manufactured semiconductor devices is favorable with no variation in the product quality. By using the semiconductor device of the present invention, electronic appliances can be manufactured with high throughput and favorable quality. Specific examples are described with reference to the drawings. However, since the present invention can be embodied with many different modes, it is easily understood by those skilled in the art that the modes and details can be variously changed without departing from the scope and spirit of the present invention. Therefore, the present invention should not be construed as being limited to the description of this embodiment mode. This embodiment mode can be freely combined with another embodiment modes.

Figure 19A:
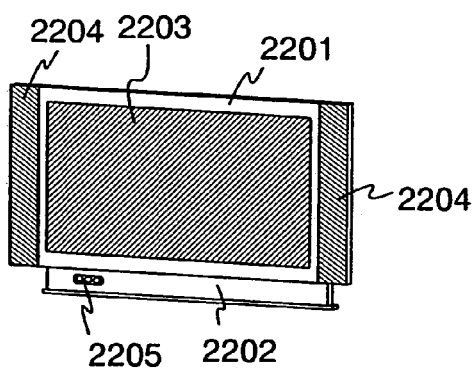
FIGS. 19A to 19F schematically show electronic appliances each using a semiconductor device of the present invention.

FIG. 19A shows a display device including a case 2201, a supporter 2202, a display portion 2203, a speaker portion 2204, a video input terminal 2205, and the like. Pixels in the display portion 2203 include thin film transistors which are manufactured by the similar method to Embodiment Mode 3. This makes it possible to enlarge the area of a crystal region without causing interference stripes due to laser irradiation to appear on a semiconductor film, to decrease the area of an inferior crystallinity region, and to increase the productivity of the display device. Moreover, since a laser irradiation process of a large substrate can be carried out effectively by the present invention, the productivity of the display device can be increased. Therefore, the manufacturing cost of a large-screen display device can be decreased. Further, the display device may have a memory, a driver circuit portion, and the like, and the semiconductor device of the present invention may be applied to the memory, the driver circuit portion, and the like. The display device includes various display devices in which thin film transistors and various display media are combined, such as a liquid crystal display device using an electro-optic effect of a liquid crystal, a display device using a luminescent material such as electroluminescence, a display device using an electron source element, or a display device using a contrast medium (also referred to as electronic ink) whose reflectivity depends on the application of an electric field. The display device can be used for all kinds of information display appliances, such as computers, televisions, information display appliances like electronic books, advertisement display, or guidance display.

Figure 19B:
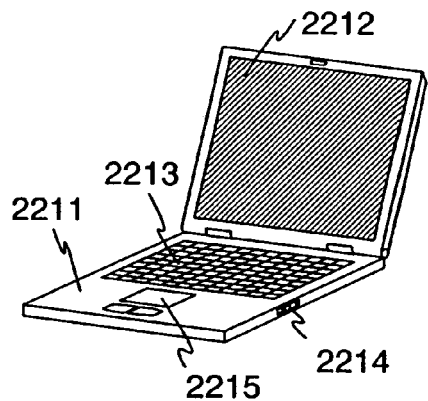

FIG. 19B shows a computer including a case 2211, a display portion 2212, a keyboard 2213, an external connection port 2214, a pointing mouse 2215, and the like. Thin film transistors are used in the display portion 2212 and a CPU, a memory, a driver circuit portion, and the like attached to the computer. By using the thin film transistors manufactured by using the laser irradiation apparatus of the present invention in the display portion 2212 and the CPU, the memory, the driver circuit portion, and the like attached to the computer, the product quality can be improved and the variation in the product quality can be decreased.

Figure 19C:
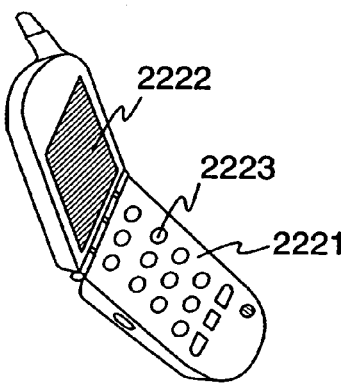

FIG. 19C shows a mobile phone as a typical example of mobile terminals. This mobile phone includes a case 2221, a display portion 2222, an operation key 2223, and the like. Thin film transistors are used in the display portion 2222 and a CPU, a memory, a driver circuit portion, and the like attached to the mobile phone. By using the thin film transistors manufactured by using the laser irradiation apparatus of the present invention in the display portion 2222 and the CPU, the memory, the driver circuit portion, and the like attached to the mobile phone, the product quality can be improved and the variation in the quality can be decreased. The semiconductor devices manufactured by using the laser irradiation apparatus of the present invention can be used in electronic appliances such as a PDA (Personal Digital Assistant), a digital camera, and a compact game machine, in addition to the mobile phone.

Figure 19D:
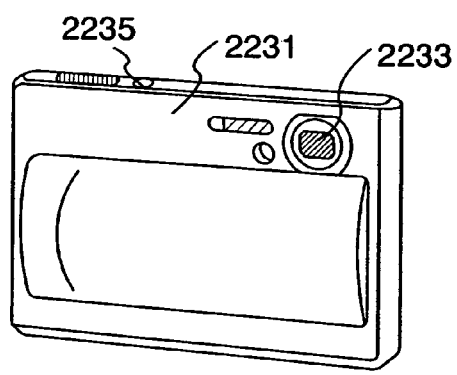
Figure 19E:
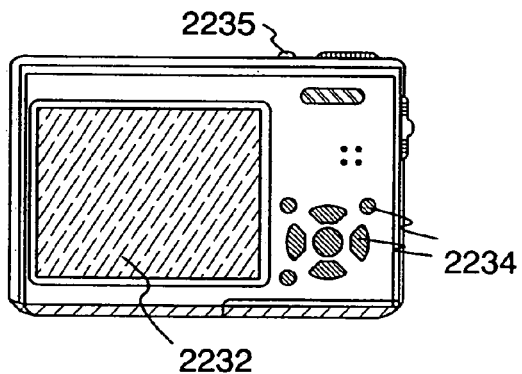

FIGS. 19D and 19E show a digital camera. FIG. 19E shows a rear side of the digital camera shown in FIG. 19D. This digital camera includes a case 2231, a display portion 2232, a lens 2233, operation keys 2234, a shutter 2235, and the like. Thin film transistors are used in the display portion 2232, a driver circuit portion for controlling the display portion 2232, and the like. By using the thin film transistors manufactured by using the laser irradiation apparatus of the present invention to the display portion 2232, the driver circuit portion for controlling the display portion 2232, and other circuits, the product quality can be improved and the variation in the product quality can be decreased.

Figure 19F:
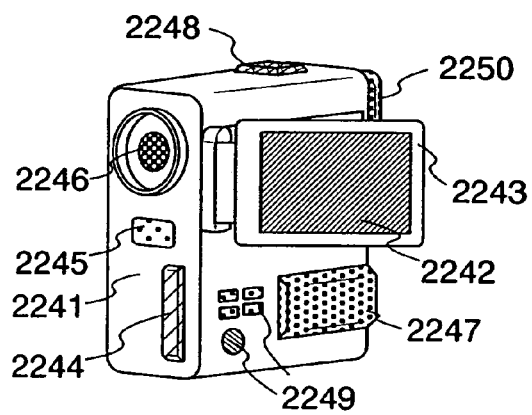

FIG. 19F shows a digital video camera including a main body 2241, a display portion 2242, a case 2243, an external connection port 2244, a remote control receiving portion 2245, an image receiving portion 2246, a battery 2247, an audio input portion 2248, operation keys 2249, an eyepiece portion 2250, and the like. Thin film transistors are used in the display portion 2242 and a driver circuit portion for controlling the display portion 2242. By using the thin film transistors manufactured by using the laser irradiation apparatus of the present invention to the display portion 2242, the driver circuit portion for controlling the display portion 2242, and other circuits, the product quality can be improved and the variation in the product quality can be decreased.

Moreover, the thin film transistors manufactured by using the laser process apparatus of the present invention can be used for a thin film integrated circuit or a contactless thin film integrated circuit device (also referred to as a wireless IC tag or an RFID (Radio Frequency IDentification) tag). A thin film integrated circuit and a contactless thin film integrated circuit manufactured by using the manufacturing method shown in another embodiment modes can be used for a tag or a memory.

Figure 20A:
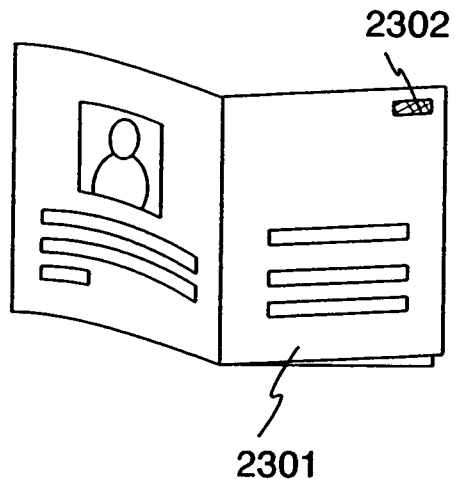
FIGS. 20A and 20B schematically show goods each using a semiconductor device of the present invention.

FIG. 20A shows a passport 2301 with a wireless IC tag 2302 pasted thereto. Alternatively, the wireless IC tag 2302 may be embedded in the passport 2301. Similarly, the wireless IC tag can be attached or embedded in a driver's license, a credit card, a banknote, a coin, a certificate, a merchandise coupon, a ticket, a traveler's check (T/C), a health insurance card, a resident card, a family register, and the like. In this case, only the information saying this is the real one is input in the wireless IC tag and an access authority is set so that the information cannot be read and written illegally. By using the tag in this way, it is possible to distinguish the forged one and the real one.

Figure 20B:
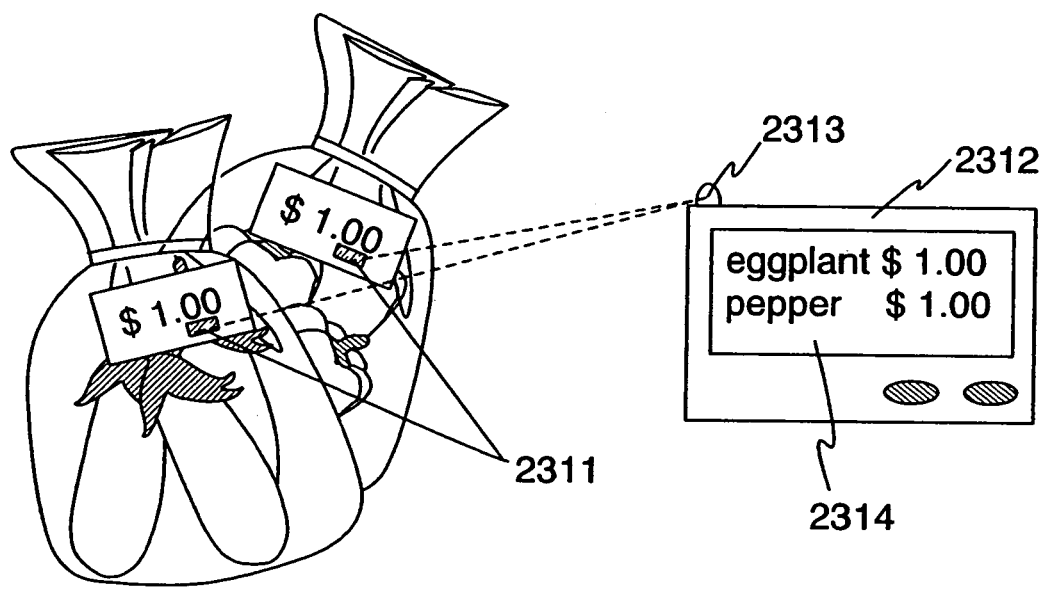

Besides, the wireless IC tag can be used as a memory. FIG. 20B shows an example of embedding a wireless IC tag 2311 in a label to be pasted to a package of vegetables. Alternatively, the wireless IC tag may be attached directly to the package or embedded in the package. In the wireless IC tag 2311, a production area, a producer, a manufacturing date, and a process at a production stage such as a process method, a circulation process of the product, a price, quantity, an intended purpose, a shape, weight, an expiration date, each kind of authentication information, and the like can be recorded. Information from the wireless IC tag 2311 is received by an antenna portion 2313 of a wireless reader 2312 and read out thereby, and displayed in a display portion 2314 of the reader 2312. Thus, wholesalers, retailers, and consumers can know the information easily. Moreover, access authority can be set for each of producers, traders, and consumers. Those who do not have the access authority cannot read, write, rewrite, and erase the data in the wireless IC tag.

The wireless IC tag can be used in the following way. At the payment, the information that the payment has been made is written in the wireless IC tag, and the wireless IC tag is checked by a checking means provided at an exit whether or not the information that the payment has been made is written in the wireless IC tag. If the IC tag is brought out from the store without making the payment, the alarm rings. With this method, forgetting of the payment and shoplifting can be prevented.

In consideration of protecting customer's privacy, the following method is also possible. At the payment at a cash register, any of the followings is conducted; (1) data input in the wireless IC tag are locked by pin numbers or the like, (2) data itself input in the wireless IC tag are encrypted, (3) data input in the wireless IC tag are erased, and (4) data input in the wireless IC tag are destroyed. Then, a checking means is provided at an exit, and whether any one of (1) to (4) has been conducted or whether the data in the wireless IC tag are not processed is checked so that whether the payment has been made or not is checked. In this way, whether the payment has been made or not can be checked in the store, and reading out the information in the wireless IC tag against the owner's will outside the store can be prevented.

Several methods are given to destroy the data input in the wireless IC tag in (4). For example, (a) only data are destroyed by writing one or both of "0 (off)" and "1 (on)" in at least a part of electronic data in the wireless IC tag, or (b) current is fed excessively in the wireless IC tag to physically destroy a part of a wiring in a semiconductor element in the wireless IC tag.

Since the manufacturing cost of these wireless. IC tags mentioned above is higher than that of conventionally used barcodes, the cost reduction is necessary. According to the present invention, however, since uniform laser annealing of a semiconductor film is possible, semiconductor devices with favorable product quality and no variation can be effectively manufactured, which is effective in the cost reduction. Furthermore, by using the present invention, the wireless IC tags can be manufactured so that any wireless IC tag has high product quality and no variation of performance.

As thus described, the semiconductor device manufactured by the present invention can be applied in a wide range, and the semiconductor device manufactured by the present invention can be applied to electronic appliances of every field.

This application is based on Japanese Patent Application serial no. 2005-096212 filed in Japan Patent Office on Mar. 29, 2005, the entire contents of which are hereby incorporated by reference.

EXPLANATION OF REFERENCE

101: IRRADIATION BODY, 102: X-AXIS STAGE, 111: LASER OSCILLATOR, 112: LASER OSCILLATOR, 113: LASER OSCILLATOR, 114: LASER OSCILLATOR, 121: SLIT, 122: SLIT, 123: SLIT, 124: SLIT, 131: MIRROR, 132: MIRROR, 133: MIRROR, 134: MIRROR, 141: CYLINDRICAL LENS, 142: CYLINDRICAL LENS, 143: CYLINDRICAL LENS, 144: CYLINDRICAL LENS, 151: CYLINDRICAL LENS, 152: CYLINDRICAL LENS, 153: CYLINDRICAL LENS, 154: CYLINDRICAL LENS, 161: LINEAR BEAM, 162: LINEAR BEAM, 163: LINEAR BEAM, 164: LINEAR BEAM, 171: CCD CAMERA, 172: CCD CAMERA, 173: CCD CAMERA, 174: CCD CAMERA, 181: ALIGNMENT MARKER, 182: ALIGNMENT MARKER, 183: ALIGNMENT MARKER, 184: ALIGNMENT MARKER, 201: Y-AXIS STAGE, 202: Y-AXIS STAGE, 203: Y-AXIS STAGE, 204: Y-AXIS STAGE, 211: TABLE, 221: FIRST OPTICAL SYSTEM AND LASER OSCILLATOR, 222: SECOND OPTICAL SYSTEM AND LASER OSCILLATOR, 223: THIRD OPTICAL SYSTEM AND LASER OSCILLATOR, 224: FOURTH OPTICAL SYSTEM AND LASER OSCILLATOR, 231: SUPPORTER, 232: SUPPORTER, 233: SUPPORTER, 234: SUPPORTER, 241: SUPPORTER, 242: SUPPORTER, 371: CCD CAMERA, 382: ALIGNMENT MARKER, 405: Y-AXIS STAGE, 500a: LINEAR BEAM, 500b: LINEAR BEAM, 500c: LINEAR BEAM, 501: IRRADIATION BODY, 502: REGION, 503: REGION, 504: LASER OSCILLATOR, 505: LASER OSCILLATOR, 506: LASER OSCILLATOR, 601a: ALIGNMENT MARKER, 601b: ALIGNMENT MARKER, 601c: ALIGNMENT MARKER, 601d: ALIGNMENT MARKER, 602a: DOTTED-LINE ARROW, 602b: DOTTED-LINE ARROW, 602c: DOTTED-LINE ARROW, 602d: DOTTED-LINE ARROW, 603a: ARROW, 603b: ARROW, 603c: ARROW, 603d: ARROW, 604a: DOTTED-LINE ARROW, 604b: DOTTED-LINE ARROW, 604c: DOTTED-LINE ARROW, 604d: DOTTED-LINE ARROW, 605a: CRYSTAL REGION, 605b: CRYSTAL REGION, 605c: CRYSTAL REGION, 606c: CRYSTAL REGION, 606d: CRYSTAL REGION, 700: INSULATING SUBSTRATE, 701: BASE FILM, 702: AMORPHOUS SEMICONDUCTOR FILM, 704: ISLAND-SHAPED SEMICONDUCTOR FILM, 705: ISLAND-SHAPED SEMICONDUCTOR FILM, 706: ISLAND-SHAPED SEMICONDUCTOR FILM, 707: ISLAND-SHAPED SEMICONDUCTOR FILM, 708: GATE INSULATING FILM, 710: N-TYPE TRANSISTOR, 711: P-TYPE TRANSISTOR, 712: N-TYPE TRANSISTOR, 713: P-TYPE TRANSISTOR, 714: INSULATING FILM, 715: ORGANIC INSULATING FILM, 716: WIRING, 717: WIRING, 718: WIRING, 719: WIRING, 720: WIRING, 721: WIRING, 722: WIRING, 723: WIRING, 724: INSULATING FILM, 802a: DOTTED-LINE ARROW, 802b: DOTTED-LINE ARROW, 802c: DOTTED-LINE ARROW, 802d: DOTTED-LINE ARROW, 803a: ARROW, 803b: ARROW, 803c: ARROW, 803d: ARROW, 804a: DOTTED-LINE ARROW, 804b: DOTTED-LINE ARROW, 804c: DOTTED-LINE ARROW, 804d: DOTTED-LINE ARROW, 805a: CRYSTAL REGION, 805b: CRYSTAL REGION, 805c: CRYSTAL REGION, 805d: CRYSTAL REGION, 806a: CRYSTAL REGION, 806b: CRYSTAL REGION, 806c: CRYSTAL REGION, 806d: CRYSTAL REGION, 1401: IRRADIATION STARTING POSITION, 1402: IRRADIATION STARTING POSITION, 1403: IRRADIATION STARTING POSITION, 1404: IRRADIATION STARTING POSITION, 1700: GLASS SUBSTRATE, 1701: PEELING LAYER, 1702: BASE INSULATING FILM, 1703: SEMICONDUCTOR FILM, 1705: ISLAND-SHAPED SEMICONDUCTOR FILM, 1706: ISLAND-SHAPED SEMICONDUCTOR FILM, 1707: SEMICONDUCTOR FILM, 1708: GATE INSULATING FILM, 1709: GATE ELECTRODE, 1710: GATE ELECTRODE, 1711: GATE ELECTRODE, 1712: RESIST, 1713: RESIST, 1716: LOW-CONCENTRATION IMPURITY REGION, 1717: LOW-CONCENTRATION IMPURITY REGION, 1718: RESIST, 1720: HIGH-CONCENTRATION IMPURITY REGION, 1721: INSULATING FILM, 1722: SIDEWALL, 1723: SIDEWALL, 1724: SIDEWALL, 1726: RESIST, 1727: HIGH-CONCENTRATION IMPURITY REGION, 1728: HIGH-CONCENTRATION IMPURITY REGION, 1730: N-CHANNEL TFT, 1731: P-CHANNEL TFT, 1732: N-CHANNEL TFT, 1733: FIRST INTERLAYER INSULATING FILM, 1734: SECOND INTERLAYER INSULATING FILM, 1735: WIRING 1736: WIRING, 1737: WIRING, 1738: WIRING, 1739: WIRING, 1741: THIRD INTERLAYER INSULATING FILM, 1742: ANTENNA, 1745: PROTECTIVE LAYER, 1746: GROOVE, 1750: ADHESIVE, 1751: SECOND SUBSTRATE, 1752: ADHESIVE, 2201: CASE, 2202: SUPPORTER, 2203: DISPLAY PORTION, 2204: SPEAKER PORTION, 2205: VIDEO INPUT TERMINAL, 2211: CASE, 2212: DISPLAY PORTION, 2213: KEYBOARD, 2214: EXTERNAL CONNECTION PORT, 2215: POINTING MOUSE, 2221: CASE, 2222: DISPLAY PORTION, 2223: OPERATION KEY, 2231: CASE, 2232: DISPLAY PORTION, 2233: LENS, 2234: OPERATION KEY, 2235: SHUTTER, 2241: MAIN BODY, 2242: DISPLAY PORTION, 2243: CASE, 2244: EXTERNAL CONNECTION PORT, 2245: REMOTE CONTROL RECEIVING PORTION, 2246: IMAGE RECEIVING PORTION, 2247: BATTERY, 2248: AUDIO INPUT PORTION, 2249: OPERATION KEY, 2250: EYEPIECE PORTION.

The invention claimed is:

1. A laser irradiation apparatus comprising:
a first laser oscillator configured to emit a first laser beam;
a second laser oscillator configured to emit a second laser beam;
a first optical system configured to shape the first laser beam into a first linear beam on a surface of an irradiation body;
a second optical system configured to shape the second laser beam into a second linear beam on the surface of the irradiation body;
means for moving the irradiation body in a direction along a short side of the first linear beam;
first supports provided at sides of the means for moving the irradiation body;
a second support and a third support extending between the first supports over the means for moving the irradiation body;
means for moving the first laser oscillator and the second laser oscillator independently from each other in a direction along a long side of the first linear beam over the second support and the third support; and
means for detecting at least one alignment marker, wherein the means for detecting at least one alignment marker comprises a light source with a wavelength range of 200 to 500 nm, and wherein the first laser oscillator and the second laser oscillator are provided so that outputted beams are parallel and in opposite directions to each other and an output portion of the first laser oscillator and an output portion of the second laser oscillator do not face each other.

2. The laser irradiation apparatus according to claim 1, wherein the means for detecting at least one alignment marker comprises a CCD camera.

3. The laser irradiation apparatus according to claim 1, wherein each of the first linear beam and the second linear beam has a rectangular or elliptical shape.

4. The laser irradiation apparatus according to claim 1, wherein the first laser oscillator and the second laser oscillator are YAG lasers, $YVO_4$ lasers, $GdVO_4$ lasers, YLF lasers, or Ar lasers.

5. The laser irradiation apparatus according to claim 1, wherein the first laser oscillator and the second laser oscillator have different output power respectively.

6. The laser irradiation apparatus according to claim 1, wherein the first optical system and the second optical system each include at least two cylindrical lenses.

7. The laser irradiation apparatus according to claim 1, wherein the means for detecting at least one alignment marker comprises a light source of a single color.

8. The laser irradiation apparatus according to claim 1, wherein the means for moving the first laser oscillator and the second laser oscillator is configured to move only in the direction along the long side of the first linear beam.

9. The laser irradiation apparatus according to claim 1, wherein the means for moving the irradiation body has a suction function.

10. The laser irradiation apparatus according to claim 1 further comprising:

means for extracting a contour portion of the alignment marker, wherein the means for extracting the contour portion comprises a Sobel process.

11. A laser irradiation apparatus comprising:

a first laser oscillator configured to emit a first laser beam;

a second laser oscillator configured to emit a second laser beam;

a first optical system configured to shape the first laser beam into a first linear beam on a surface of an irradiation body;

a second optical system configured to shape the second laser beam into a second linear beam on the surface of the irradiation body;

means for determining a laser irradiation position, which has means for detecting at least one alignment marker and an image processing device;

a first stage over which the irradiation body is provided and which is configured to move in a short-side direction of the first linear beam;

first supports provided at sides of the first stage;

a second support and a third support extending between the first supports over the first stage; and a plurality of second stages which are configured to move in a long-side direction of the first linear beam over the second support and the third support;

wherein the plurality of second stages have independent moving mechanisms respectively, wherein the means for detecting at least one alignment marker comprises a light source with a wavelength range of 200 to 500 nm, and wherein the first laser oscillator and the second laser oscillator are provided so that outputted beams are parallel and in opposite directions to each other and an output portion of the first laser oscillator and an output portion of the second laser oscillator do not face each other.

12. The laser irradiation apparatus according to claim 11, wherein the means for detecting at least one alignment marker comprises a CCD camera.

13. The laser irradiation apparatus according to claim 11, wherein each of the first linear beam and the second linear beam has a rectangular or elliptical shape.

14. The laser irradiation apparatus according to claim 11, wherein the first laser oscillator and the second laser oscillator are YAG lasers, $YVO_4$ lasers, $GdVO_4$ lasers, YLF lasers, or Ar lasers.

15. The laser irradiation apparatus according to claim 11, wherein the first laser oscillator and the second laser oscillator have different output power respectively.

16. The laser irradiation apparatus according to claim 11, wherein the first optical system and the second optical system each include at least two cylindrical lenses.

17. The laser irradiation apparatus according to claim 11, wherein the means for detecting at least one alignment marker comprises a light source of a single color.

18. The laser irradiation apparatus according to claim 11, wherein the plurality of second stages are configured to move only in the long-side direction of the first linear beam.

19. The laser irradiation apparatus according to claim 11, wherein the first stage has a suction function.

20. The laser irradiation apparatus according to claim 11 further comprising:

means for extracting a contour portion of the alignment marker, wherein the means for extracting the contour portion comprises a Sobel process.

21. A method for manufacturing a semiconductor device comprising:

providing an insulating substrate having an amorphous semiconductor film over a first stage;

detecting at least one alignment marker provided over the insulating substrate with a light source having a wavelength range of 200 to 500 nm;

determining a first position on a surface of the amorphous semiconductor film which is irradiated with a first linear beam emitted from a first laser oscillator mounted on a second stage and a second position on the surface of the amorphous semiconductor film which is irradiated with a second linear beam emitted from a second laser oscillator mounted on a third stage, by moving the second stage and the third stage independently from each other along a first support and a second support, respectively, in a direction along a long side of the first linear beam; and crystallizing the amorphous semiconductor film by moving the first stage in a direction along a short side of the first linear beam, wherein the first laser oscillator and the second laser oscillator are provided so that outputted beams are parallel and in opposite directions to each other and an output portion of the first laser oscillator and an output portion of the second laser oscillator do not face each other.

22. The method for manufacturing the semiconductor device according to claim 21, wherein each of the second stage and the third stage has one laser oscillator provided thereover.

23. The method for manufacturing the semiconductor device according to claim 21,
wherein the first laser oscillator and the second laser oscillator have different output power respectively.

24. The method for manufacturing a semiconductor device according to claim 21,
wherein the second stage and the third stage are configured to move only in a direction along the long side of the first linear beam.

25. The method for manufacturing a semiconductor device according to claim 21,
wherein the first stage has a suction function.

26. The method for manufacturing a semiconductor device according to claim 21 further comprising:
extracting a contour portion of the alignment marker by a Sobel process.

27. A method for manufacturing a semiconductor device comprising:
forming a plurality of alignment markers by an amorphous semiconductor film over an insulating substrate;
providing the insulating substrate over a first stage;
detecting at least one alignment marker of the plurality of alignment markers with a light source having a wavelength range of 200 to 500 nm;
determining a first position on a surface of the amorphous semiconductor film which is irradiated with a first linear beam emitted from a first laser oscillator mounted on a second stage and a second position on the surface of the amorphous semiconductor film which is irradiated with a second linear beam emitted from a second laser oscillator mounted on a third stage, by adjusting in such a way that the second stage and the third stage are independently moved along a first support and a second support, respectively, in a direction along a long side of the first linear beam based on positions of the plurality of alignment markers; and
crystallizing the amorphous semiconductor film by moving the first stage in a direction along a short side of the first linear beam,
wherein the first laser oscillator and the second laser oscillator are provided so that outputted beams are parallel and in opposite directions to each other and an output portion of the first laser oscillator and an output portion of the second laser oscillator do not face each other.

28. The method for manufacturing the semiconductor device according to claim 27,
wherein each of the second stage and the third stage has one laser oscillator provided thereover.

29. The method for manufacturing the semiconductor device according to claim 27,
wherein the first laser oscillator and the second laser oscillator have different output power respectively.

30. The method for manufacturing a semiconductor device according to claim 27,
wherein the second stage and the third stage are configured to move only in the direction along the long side of the first linear beam.

31. The method for manufacturing a semiconductor device according to claim 27,
wherein the first stage has a suction function.

32. The method for manufacturing a semiconductor device according to claim 27 further comprising:
extracting a contour portion of the alignment marker by a Sobel process.

33. A laser irradiation apparatus comprising:
a plurality of laser oscillators including a first laser oscillator and a second laser oscillator;
a first stage for moving an irradiation body relative to a linear beam in a direction along a short side of the linear beam;
first supports provided at sides of the first stage;
a second support and a third support extending between the first supports over the first stage;
a plurality of optical systems;
a plurality of second stages for moving the plurality of laser oscillators and the plurality of optical systems independently from each other in a direction along a long side of the linear beam; and
means for detecting at least one alignment marker which is provided on the irradiation body,
wherein the plurality of second stages are provided over the first stage by the second support and the third support,
wherein the first laser oscillator is provided on one of the plurality of second stages provided by the second support,
wherein the second laser oscillator is provided on another one of the plurality of second stages provided by the third support,
wherein one of the plurality of optical systems is configured to shape a laser beam emitted from one of the plurality of laser oscillators into the linear beam on a surface of the irradiation body,
wherein the means for detecting at least one alignment marker comprises a light source with a wavelength range of 200 to 500 nm, and
wherein the first laser oscillator and the second laser oscillator are provided so that outputted beams are parallel and in opposite directions to each other and an output portion of the first laser oscillator and an output portion of the second laser oscillator do not face each other.

34. The laser irradiation apparatus according to claim 33,
wherein the linear beam has a rectangular or elliptical shape.

35. The laser irradiation apparatus according to claim 33,
wherein the plurality of laser oscillators are continuous wave laser oscillators.

36. The laser irradiation apparatus according to claim 33, further comprising a slit.

37. The laser irradiation apparatus according to claim 36,
wherein the means for detecting at least one alignment marker comprises a CCD camera.

38. The laser irradiation apparatus according to claim 36,
wherein the means for detecting at least one alignment marker comprises a light source of a single color.

39. The laser irradiation apparatus according to claim 33,
wherein the plurality of optical systems each include at least two cylindrical lenses.

40. The laser irradiation apparatus according to claim 33,
wherein the plurality of second stages are configured to move only in the direction along the long side of the linear beam.

41. The laser irradiation apparatus according to claim 33,
wherein the first stage has a suction function.

42. The laser irradiation apparatus according to claim 33 further comprising:
means for extracting a contour portion of the alignment marker, wherein the means for extracting the contour portion comprises a Sobel process.

43. A method for manufacturing a semiconductor device comprising:
providing a substrate having a semiconductor film over a first stage;

detecting at least one alignment marker provided over the substrate with a light source having a wavelength range of 200 to 500 nm;

shaping a laser beam emitted from one of a plurality of laser oscillators including a first laser oscillator and a second laser oscillator into a linear beam on a surface of the semiconductor film by using one of a plurality of optical systems each provided over a plurality of second stages provided over the first stage by a second support and a third support which extend between first supports provided at sides of the first stage;

determining a position on the surface of the semiconductor film to be irradiated with the linear beam, by moving the plurality of second stages independently from each other along a long side of the linear beam; and irradiating the semiconductor film with the linear beam while moving the first stage in a direction along a short side of the linear beam, wherein the first laser oscillator which is provided on one of the plurality of second stages provided by the second support and the second laser oscillator which is provided on another one of the plurality of second stages provided by the third support are provided so that outputted beams are parallel and in opposite directions to each other and an output portion of the first laser oscillator and an output portion of the second laser oscillator do not face each other.

44. The method for manufacturing a semiconductor device according to claim 43, wherein the linear beam has a rectangular or elliptical shape.

45. The method for manufacturing a semiconductor device according to claim 43, wherein the plurality of laser oscillators are continuous wave laser oscillators.

46. The method for manufacturing a semiconductor device according to claim 43, further comprising a step of forming a plurality of alignment markers over the substrate.

47. The method for manufacturing a semiconductor device according to claim 43, wherein the plurality of optical systems each include at least two cylindrical lenses.

48. The method for manufacturing a semiconductor device according to claim 43, wherein the plurality of second stages are configured to move only in the direction along the long side of the linear beam.

49. The method for manufacturing a semiconductor device according to claim 43, wherein the first stage has a suction function.

50. The method for manufacturing a semiconductor device according to claim 43 further comprising:

extracting a contour portion of the alignment marker by a Sobel process.

51. A method for manufacturing a semiconductor device comprising:

providing a substrate having a semiconductor film over a stage;

detecting at least one alignment marker provided over the substrate with a light source having a wavelength range of 200 to 500 nm;

irradiating a first portion of the semiconductor film with a first laser beam emitted from a first laser oscillator through a first optical system;

irradiating a second portion of the semiconductor film with a second laser beam emitted from a second laser oscillator through a second optical system;

moving the stage along a first direction simultaneously as the irradiation of the semiconductor film with the first laser beam and the second laser beam, the first direction being a direction along a short side of the first laser beam; and moving the first optical system and the second optical system along a second direction after moving the stage along the first direction, the second direction being a direction substantially perpendicular to the first direction, wherein the first laser oscillator and the second laser oscillator are provided so that outputted beams are parallel and in opposite directions to each other and an output portion of the first laser oscillator and an output portion of the second laser oscillator do not face each other.

52. The method for manufacturing a semiconductor device according to claim 51, wherein the first optical system and the second optical system each include at least two cylindrical lenses.

53. The method for manufacturing a semiconductor device according to claim 51, wherein the first optical system and the second optical system are configured to move only in the second direction.

54. The method for manufacturing a semiconductor device according to claim 51, wherein the stage has a suction function.

55. The method for manufacturing a semiconductor device according to claim 51 further comprising:

extracting a contour portion of the alignment marker by a Sobel process.

* * * * *